United States Patent
Bauer

(10) Patent No.: US 9,190,515 B2
(45) Date of Patent: *Nov. 17, 2015

(54) STRUCTURE COMPRISES AN AS-DEPOSITED DOPED SINGLE CRYSTALLINE SI-CONTAINING FILM

(75) Inventor: Matthias Bauer, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/705,454

(22) Filed: Feb. 12, 2010

(65) Prior Publication Data

US 2010/0140744 A1    Jun. 10, 2010

Related U.S. Application Data

(62) Division of application No. 11/343,244, filed on Jan. 30, 2006, now Pat. No. 7,687,383.

(60) Provisional application No. 60/649,990, filed on Feb. 4, 2005, provisional application No. 60/663,434, filed on Mar. 18, 2005, provisional application No. 60/668,420, filed on Apr. 4, 2005.

(51) Int. Cl.
*H01L 21/02* (2006.01)
*H01L 29/78* (2006.01)
(Continued)

(52) U.S. Cl.
CPC ............ *H01L 29/7848* (2013.01); *C23C 16/04* (2013.01); *C23C 16/22* (2013.01); *C23C 16/24* (2013.01); *C23C 16/32* (2013.01); *C23C 16/325* (2013.01); *C23C 16/45512* (2013.01);
(Continued)

(58) Field of Classification Search
CPC ................... H01L 29/7848; H01L 21/02636; H01L 21/3215; H01L 29/66628; H01L 29/66636; H01L 29/7834
See application file for complete search history.

(56) References Cited

U.S. PATENT DOCUMENTS 4,058,430 A    11/1977  Suntola et al.
4,413,022 A    11/1983  Suntola et al.
(Continued)

FOREIGN PATENT DOCUMENTS

DE    19820147    7/1999
JP    2002-064105    2/2002
(Continued)

OTHER PUBLICATIONS

"Diffusion in Silicon" by Scotten W. Jones published by ICKnowledge LLC (2000) available at www.icknowledge.com/misc_technology/Diffusion.pdf, (2000).
(Continued)

*Primary Examiner* — Khiem D Nguyen
(74) *Attorney, Agent, or Firm* — Knobbe Martens Olson & Bear LLP

(57) ABSTRACT

Methods of making Si-containing films that contain relatively high levels of Group III or Group V dopants involve chemical vapor deposition using trisilane and a dopant precursor. Extremely high levels of substitutional incorporation may be obtained, including crystalline silicon films that contain at least about $3 \times 10^{20}$ atoms $cm^{-3}$ of an electrically active dopant. Substitutionally doped Si-containing films may be selectively deposited onto the crystalline surfaces of mixed substrates by introducing an etchant gas during deposition.

12 Claims, 20 Drawing Sheets

(51) Int. Cl.

| | | |
|---|---|---|
| *C23C 16/04* | (2006.01) | |
| *C23C 16/22* | (2006.01) | |
| *C23C 16/24* | (2006.01) | |
| *C23C 16/32* | (2006.01) | |
| *C23C 16/455* | (2006.01) | |
| *C30B 25/02* | (2006.01) | |
| *C30B 29/06* | (2006.01) | |
| *H01L 21/3205* | (2006.01) | |
| *H01L 21/3215* | (2006.01) | |
| *H01L 29/165* | (2006.01) | |
| *H01L 29/66* | (2006.01) | |

(52) U.S. Cl.
CPC .............. *C30B25/02* (2013.01); *C30B 29/06* (2013.01); *H01L 21/0262* (2013.01); *H01L 21/02381* (2013.01); *H01L 21/02529* (2013.01); *H01L 21/02532* (2013.01); *H01L 21/02576* (2013.01); *H01L 21/02579* (2013.01); *H01L 21/02636* (2013.01); *H01L 21/02639* (2013.01); *H01L 21/3215* (2013.01); *H01L 21/32056* (2013.01); *H01L 29/165* (2013.01); *H01L 29/66628* (2013.01); *H01L 29/66636* (2013.01); *H01L 29/7834* (2013.01)

(56) References Cited

U.S. PATENT DOCUMENTS

| | | | |
|---|---|---|---|
| 4,747,367 A | 5/1988 | Posa | |
| 4,761,269 A | 8/1988 | Conger et al. | |
| 5,002,630 A * | 3/1991 | Kermani et al. ............... 117/88 |
| 5,071,670 A | 12/1991 | Kelly | |
| 5,077,143 A * | 12/1991 | Barraclough et al. ........ 428/690 |
| 5,194,398 A | 3/1993 | Miyachi | |
| 5,306,666 A | 4/1994 | Izumi | |
| 5,674,781 A | 10/1997 | Huang et al. | |
| 5,711,811 A | 1/1998 | Suntola | |
| 5,769,950 A | 6/1998 | Takasu et al. | |
| 5,831,335 A | 11/1998 | Miyamoto | |
| 5,879,459 A | 3/1999 | Gadgil et al. | |
| 5,904,565 A | 5/1999 | Nguyen et al. | |
| 5,916,365 A | 6/1999 | Sherman | |
| 5,933,761 A | 8/1999 | Lee | |
| 6,037,258 A | 3/2000 | Liu et al. | |
| 6,042,654 A | 3/2000 | Comita et al. | |
| 6,048,790 A | 4/2000 | Iacoponi et al. | |
| 6,069,068 A | 5/2000 | Rathore et al. | |
| 6,077,775 A | 6/2000 | Stumborg et al. | |
| 6,083,818 A | 7/2000 | Stumborg et al. | |
| 6,093,638 A | 7/2000 | Chu et al. | |
| 6,100,184 A | 8/2000 | Zhao et al. | |
| 6,139,700 A | 10/2000 | Kang et al. | |
| 6,146,517 A | 11/2000 | Hoinkis | |
| 6,181,012 B1 | 1/2001 | Edelstein et al. | |
| 6,184,128 B1 | 2/2001 | Wang et al. | |
| 6,188,134 B1 | 2/2001 | Stumborg et al. | |
| 6,197,666 B1 * | 3/2001 | Schafer et al. ............... 438/509 |
| 6,200,893 B1 | 3/2001 | Sneh | |
| 6,203,613 B1 | 3/2001 | Gates et al. | |
| 6,207,487 B1 | 3/2001 | Kim et al. | |
| 6,207,567 B1 | 3/2001 | Wang et al. | |
| 6,225,213 B1 | 5/2001 | Urabe | |
| 6,270,572 B1 | 8/2001 | Kim et al. | |
| 6,287,965 B1 | 9/2001 | Kang et al. | |
| 6,291,876 B1 | 9/2001 | Stumborg et al. | |
| 6,303,523 B2 | 10/2001 | Cheung et al. | |
| 6,340,619 B1 | 1/2002 | Ko | |
| 6,342,448 B1 | 1/2002 | Lin et al. | |
| 6,351,039 B1 | 2/2002 | Jin et al. | |
| 6,358,829 B2 | 3/2002 | Yoon et al. | |
| 6,368,954 B1 | 4/2002 | Lopatin et al. | |
| 6,380,065 B1 | 4/2002 | Komai et al. | |
| 6,391,785 B1 | 5/2002 | Satta et al. | |
| 6,444,495 B1 | 9/2002 | Leung et al. | |
| 6,482,733 B2 | 11/2002 | Raaijmakers et al. | |
| 6,531,347 B1 | 3/2003 | Huster et al. | |
| 6,555,839 B2 | 4/2003 | Fitzgerald | |
| 6,583,015 B2 | 6/2003 | Fitzgerald et al. | |
| 6,593,191 B2 | 7/2003 | Fitzgerald | |
| 6,727,169 B1 | 4/2004 | Raaijmakers et al. | |
| 6,821,825 B2 | 11/2004 | Todd et al. | |
| 6,881,633 B2 | 4/2005 | Hokazono | |
| 6,900,115 B2 | 5/2005 | Todd | |
| 6,958,253 B2 | 10/2005 | Todd | |
| 6,962,859 B2 | 11/2005 | Todd et al. | |
| 6,969,875 B2 | 11/2005 | Fitzgerald | |
| 7,026,219 B2 | 4/2006 | Pomarede et al. | |
| 7,166,528 B2 * | 1/2007 | Kim et al. ............... 438/607 |
| 7,176,111 B2 * | 2/2007 | Baert et al. ............... 438/479 |
| 7,186,630 B2 | 3/2007 | Todd | |
| 7,285,500 B2 | 10/2007 | Todd et al. | |
| 7,335,959 B2 | 2/2008 | Curello et al. | |
| 7,585,752 B2 | 9/2009 | Todd et al. | |
| 7,648,690 B2 * | 1/2010 | Bauer et al. ............... 423/324 |
| 7,893,433 B2 | 2/2011 | Todd et al. | |
| 2001/0001742 A1 | 5/2001 | Huang et al. | |
| 2001/0034123 A1 | 10/2001 | Jeon et al. | |
| 2002/0023520 A1 | 2/2002 | Hu | |
| 2002/0168868 A1 | 11/2002 | Todd | |
| 2003/0082300 A1 * | 5/2003 | Todd et al. ............... 427/255.27 |
| 2003/0124818 A1 | 7/2003 | Luo et al. | |
| 2004/0041216 A1 | 3/2004 | Mori | |
| 2004/0224089 A1 | 11/2004 | Singh et al. | |
| 2004/0262694 A1 | 12/2004 | Chidambaram | |
| 2005/0023520 A1 | 2/2005 | Lee et al. | |
| 2005/0037598 A1 * | 2/2005 | Witvrouw ............... 438/488 |
| 2005/0079692 A1 | 4/2005 | Samoilov et al. | |
| 2005/0121719 A1 | 6/2005 | Mori | |
| 2005/0250298 A1 | 11/2005 | Bauer | |
| 2006/0011984 A1 | 1/2006 | Currie | |
| 2006/0014366 A1 | 1/2006 | Currie | |
| 2006/0115933 A1 | 6/2006 | Ye et al. | |
| 2006/0131665 A1 | 6/2006 | Murthy et al. | |
| 2006/0148151 A1 * | 7/2006 | Murthy et al. ............... 438/197 |
| 2006/0166414 A1 | 7/2006 | Carlson et al. | |
| 2006/0169668 A1 | 8/2006 | Samoilov | |
| 2006/0169669 A1 | 8/2006 | Zojaji et al. | |
| 2006/0205194 A1 | 9/2006 | Bauer | |
| 2006/0234504 A1 | 10/2006 | Bauer et al. | |
| 2006/0289900 A1 | 12/2006 | Thirupapuliyur et al. | |

FOREIGN PATENT DOCUMENTS

| | | |
|---|---|---|
| JP | 2002-289526 | 10/2002 |
| JP | 2004-532511 | 2/2004 |
| TW | 200305202 | 10/2003 |
| WO | WO 90/13138 | 11/1990 |
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 | 12/2000 |
| WO | WO 00/79576 | 12/2000 |
| WO | WO 01/15220 | 3/2001 |
| WO | WO 01/36702 | 5/2001 |
| WO | WO 01/45149 | 6/2001 |
| WO | WO 01/66832 | 9/2001 |
| WO | WO 01/78123 | 10/2001 |
| WO | WO 01/78124 | 10/2001 |
| WO | WO 01/99166 | 12/2001 |
| WO | WO 02/065516 | 8/2002 |
| WO | WO 02/080244 | 10/2002 |

(56) References Cited

FOREIGN PATENT DOCUMENTS

| WO | WO 2004/017365 | 2/2004 |
|----|----------------|--------|
| WO | WO 2004/031457 | 7/2005 |

OTHER PUBLICATIONS

Office Action dated Jul. 10, 2012 in Japanese Patent Application No. 2006-025710, (Jul. 10, 2012).
Office Action dated Mar. 13, 2012 in Japanese Patent Application No. 2007-554171, (Mar. 13, 2012).
Office Action dated Sep. 11, 2012, received in Japanese Patent Appl. No. 2007-554171.
Liu et al. "Substitutional carbon incorporation during $Si_{1-x-y}Ge_xC_y$ growth on Si(100) by molecular-beam epitaxy: Dependence on germanium and carbon", Applied Physics Letters, Jun. 12, 2000, vol. 76, No. 24, pp. 3546-3548.
Search Report dated Oct. 20, 2012 received in Taiwanese Application No. 095103696.
Abeles et al., Amorphous Semiconductor Superlattices: Physical Review Letters; Nov. 21, 1983; pp. 2003-2006; vol. 51; No. 21.
Antonell et al., "Carbon incorporation for strain compensation during solid phase epitaxial recrystallization of SiGe on Si at 500—600° C.", J. Appl. Phys. 79 (10), pp. 7646-7651 (1996).
Aoyama, T., "Si Selective Epitaxial Growth Using Cl2 Pulsed Molecular Flow Method," Thin Solid Films 321 (1998) 256-260, © 1998 Elsevier Science S.A.
Bauer et al., "Si3H8 based epitaxy of biaxially stressed silicon films doped with carbon and arsenic for CMOS applications", in Semiconductor Defect Engineering—Materials, Synthetic Structures and Devices, edited by S. Ashok, J. Chevallier, B.L. Sopori, M. Tabe, and P. Kiesel (Mater. Res. Soc. Symp. Proc. 864, Warrendale, PA, 2005), E4.30, (2005).
Bauer et al., "Time resolved reflectivity measurements of silicon solid phase epitaxial regrowth", Thin Solid Films 364, pp. 228-232 (2000).
Bedair, Selective area and sidewall growth by atomic layer epitaxy; Semicond Sci. Technol; 1993; 1052-1062; vol. 8.
Düscö et al., Deposition of Tin Oxide into Porous Silicon by Atomic Layer Epitaxy; J. Electrochem. Soc.; Feb. 1996; pp. 683-687; vol. 143, No. 2.
Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).
Fazan et al., A High-C Capacitor (20.4 Ff/μm2) with Ultrathin CVD—Ta2O5 Films Deposited on Rugged Poly-Si for High Density DRAMs; IEEE; 1992; pp. IDEM 92-263-IDEM-92-266.
Feng et al., "Raman determination of layer stresses and strains for heterostructures and its application to the cubic SiC/Si system", J. Appl. Phys. 64 (12), pp. 6827-6835 (1988).
George et al., Nucleation and Growth During Tungsten Atomic Layer Deposition on Oxide Surfaces; Mat. Res. Symp. Proc. vol. 672; Materials Research Society 2001; 07.7.1-07.7.7.
Haukka et al., Chemisorption of chromium acetylacetonate on porous high surface area silica; Applied Surface Science; 1994; pp. 220-227.
Hiltunen et al., Nitrides of Titanium, Niobium, Tantalum and Molybdenum Grown as Thin Films by the Atomic Layer Epitaxy Method; Thin Solid Films; 1988; pp. 149-154; vol. 166.
Horiike et al., Filling of Si Oxide into a Deep Trench using Digital CVD Method; Applied Surface Science; 1990; pp. 168-174; vol. 46.
Hoyt, "Substitutional carbon incorporation and electronic characterization of Si1—yCy/Si and Si1—x—yGexCy/Si heterojunctions", Chapter 3 in "Silicon—Germanium Carbon Alloy", Taylor and Francis (New York, NY), pp. 59-89 (2002).
Jin et al., Porous Silica Xerogel Processing and Integration for ULSI Applications; Materials Research Society Symposium Proceedings; 1998; pp. 213-222; vol. 511.
Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).
Juppo et al., Deposition of copper films by an alternate supply of CuCl and Zn; J. Vac. Sci. Technol.; 1997; pp. 2003; vol. -issue A 15(4).
Kaizuka et al., Conformal Chemical Vapor Deposition TiN(111) Film Formation as an Underlayer of Al for Highly Reliable Interconnects; Jpn. J. Appl. Phys.; 1994; pp. 470-474; vol. 33.
Kikkawa et al., A Quarter-Micrometer Interconnection Technology Using a TiN/Al—Si—Cu/TiN/Al—Si—Cu/TiN/Ti Multilayer Structure; IEEE Transactions on Electron Devices; Feb. 1993; pp. 296-302; vol. 40, No. 2.
Kikkawa et al., Al—Si—Cu/TiN multilayer interconnection and Al—Ge reflow sputtering technologies for quarter-micron devices; SPIE; 1992; pp. 54-64; vol. 1805.
Kim et al., Applicability of ALE Tin films as Cu/Si diffusion barriers; Thin Solid Films; 2000; pp. 276-283; 372(1).
Kim et al., Comparison of TiN and TiAlN as a Diffusion Barrier Deposited by Atomic Layer Deposition; Journal of the Korean Physical Society; 2002; pp. 176-179; 40(1).
Klaus et al., Atomic Layer Deposition of SiO2 Using Catalyzed and Uncatalyzed Self-Limiting Surface Reactions; Surface Review and Letters; 1999; pp. 435-448; vol. 6, Nos. 3 & 4.
Klaus et al., Atomic Layer Deposition of Tungsten Nitride Films Using Sequential Surface Reactions; J. Electrochem Soc.; 2000; 1175-1181; 147(3).
Klaus et al., Atomically controlled growth of tungsten and tungsten nitride using sequential surface reactions; Applied Surface Science; 2000; pp. 479-491; vols. 162-163.
Koo et al., Study on the characteristics of Ti AlN thin film deposited by atomic layer deposition method; Journal of Vacuum Science & Technology, A: Vacuum Surfaces, and Films; 2001; 2931-2834; 19(6).
Kouvetakis et al., "Synthesis and analysis of compounds and alloys in the GeC, SiC, and SiGeC systems", Chapter 2 in Series—Optoelectronic properties of semiconductors and superlattices; v. 15 Silicon—germanium carbon alloy / edited by S.T. Pantelides and S. Zollner; pp. 19-58, (Mar. 21, 2002).
Kukli et al., Atomic Layer Epitaxy Growth of Tantalum Oxide Thin Films from Ta(OC2H5)5 and H2O; J. Electrochem. Soc.; May 1995; pp. 1670-1674; vol. 142, No. 5.
Leskelä et al., Atomic Layer Epitaxy in Deposition of Various Oxide and Nitride Thin Films; Journal De Physique IV, Colloque C5, supplement au Journal de Physique II; Jun. 1995; pp. C5-937-C5-951; vol. 5.
MacKnight et al., "RTP applications and technology options for the sub-45 nm node", Proceedings, RTP2004 Conference (Portland, OR) (2004).
Martensson et al., Atomic layer epitaxy of copper an ab inition investigation of the CuCl/H2 process III. Reaction barriers; Appl. Surf. Sci.; 2000; 92-100; 157(1).
Martensson et al., Atomic Layer Epitaxy of Copper on Tantalum; Chemical Vapor Deposition; 1997; pp. 45-50; vol. 3, No. 1.
Martensson et al., Atomic Layer Epitaxy of Copper, Growth and Selectivity in the Cu(II)-2,2,6, 6-tetramethyl-3,5-heptanedionate/H2 Process; J. Electrochem. Soc.; Aug. 1998; pp. 2926-2931; vol. 145, No. 8.
Martensson et al., Cu(THD)2 as Copper Source in Atomic Layer Epitaxy; Proc. Electrochem. Soc.; 1997; 1529-1536; 97-25.
Martensson et al., Use of Atomic Layer Epitaxy for Fabrication of Si/TiN/Cu Structures; J. Vac. Sci. Technol. B, Sep./Oct. 1999; pp. 2122-2128; vol. 17, No. 5.
Meléndez-Lira et al., "Substitutional carbon in Si1—yCy alloys as measured with infrared absorption and Raman spectroscopy", J. Appl. Phys. 82, pp. 4246-4252 (1997).
Min et al., Atomic Layer Deposition of TiN Films by Alternate Supply of Tetrakis (ethylmethylarnino)—Titanium and Ammonia; Japanese Journal of Applied Physics; 1998; pp. 4999-5004; vol. 37.
Min et al., Chemical Vapor Deposition of Ti—Si—N Films with Alternating Source Supply; Mat. Res. Soc. Symp. Proc.; 1999; pp. 207-210; vol. 564; Materials Research Society.
Min et al., Metal-Organic Atomic-Layer Deposition of Titanium—Silicon—Nitride Films; Applied Physics Letters; 1999; pp. 1521-1523; vol. 75, No. 11.

(56) References Cited

OTHER PUBLICATIONS

Min, Atomic Layer Deposition of TiN Thin Films by Sequential Introduction of Ti Precursor and NH3; Materials Research Society Symposium Proceedings; 1998; pp. 337-343; vol. 514.

Moller, Copper and Nickel Ultrathin Films on Metal-Oxide Crystal Surfaces Mater. Soc. Monogr.; 1994; 473-522; 81.

Niinistö et al., Synthesis of oxide thin films and overlayers by atomic layer epitaxy for advanced applications; Materials Science and Engineering; 1996; pp. 23-29; vol. B41.

O'Neil et al., "Optimization of process conditions for selective silicon epitaxy using disilane, hydrogen, and chlorine", J. Electrochem. Soc. 144 (9), pp. 3309-3315 (1997).

Oehme et al., "A novel measurement method of segregating adlayers in MBE", Thin Solid Films 369, pp. 138-142 (2000).

Oehme et al., "Carbon segregation in silicon", Thin Solid Films 380, pp. 75-77 (2000).

Osten et al., "Substitutional carbon incorporation in epitaxial Si1—yCy alloys on Si(001) grown by molecular beam epitaxy", Applied Physics Letters 74 (6), pp. 836-838 (1999).

Osten et al., "Substitutional versus interstitial carbon incorporation during psuedomorphic growth of Si1—yCy on Si(001)", J. Appl. Phys. 80 (12), pp. 6711-6715 (1996).

Ott et al., Modification of Porous Alumina membranes Using Al2O3 Atomic Layer Controlled Deposition; Chem. Mater.; 1997; pp. 707-714; vol. 9.

PCT Search Report, PCT Application PCT/US2006/003333; Jun. 30, 2006.

PCT Search Report, PCT Application PCT/US2006/003465; Jul. 7, 2006.

Ritala et al., Atomic Layer Epitaxy Growth of TiN Thin Films from Tila and NH3; J. Electrochem. Soc.; Aug. 1998; pp. 2914-2920; vol. 145; No. 8.

Ritala at al., Controlled Growth of TaN, Ta3N5, and TaOxNy Thin Films by Atomic Layer Deposition; Chem. Mater.; 1999; pp. 1712-1718; vol. 11.

Ritala et al., Effects of intermediate zinc pulses on properties of TiN and NbN films deposited by atomic layer epitaxy; Appl. Surf. Sci.; 1997; 199-212; 120.

Ritala et al., Perfectly Conformal TiN and Al2O3 Films Deposited by Atomic Layer Deposition; ChemVap. Deposition; 1999; pp. 7-9; vol. 5, No. 1.

Rossnagel et al., Plasma-enhanced atomic layer deposition of Ta and Ti for interconnect diffusin barriers; J. Vac. Sci. Technol.; 2000; 2016-2020; 18(4).

Ryan et al., Material Property Characterization and Integration Issues for Mesoporous Silica; IEEE, 1999, pp. IITC 99-187-IITC 99-189.

Sakaue et al., Digital Chemical Vapor Deposition of SiO2 Using a Repetitive Reaction of Triethylsilane/Hydrogen and Oxidation; Japanese Journal of Applied Physics; Jan. 1990; pp. L124-L127; vol. 30, No. 1B.

Singer, Atomic Layer Deposition Targets Thin Films; Semiconductor International; Sep. 1999; pp. 40.

Sneh et al., Atomic layer growth of SiO2 on Si(100) using SiCl4 and H2O in a binary reaction sequence; Surface Science; 1995; pp. 135-152; vol. 334.

Solanki et al., Atomic Layer Deposition of Copper Seed Layers; Electrochem. and Solid State Lett.; 2000; 479-480; 3(10).

Strane et al., "Carbon incorporation into Si at high concentrations by ion implantation and solid phase epitaxy", J. Appl. Phys. 79 (2), pp. 637-646 (1996).

Strane et al., "Precipitation and relaxation in strained Si1—yCy/Si heterostructures", J. Appl. Phys. 76(6), pp. 3656-3668 (1994).

Tiitta et al., Preparation and Characterization of Phosphorus-Doped Aluminum Oxide Thin Films; Materials Research Bulletin; 1998; pp. 1315-1323; vol. 33, No. 9.

U.S. Department of Commerce National Technical Information Service, Ceramic Coatings on Metals Using Atomic Layer Controlled Chemical Vapor Deposition (Assert-96); Feb. 16, 2000; Colorado University at Boulder.

Utriainen et al., Studies of metallic thin film growth in an atomic layer epitaxy reactor using M(ACAC)2 (M=Ni,Cu,Pt) precursors; Appl. Surf. Sci.; 2000; 151-158; 157(3).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Wang, Spin on Dielectric Films—A General Overview; 1998 5th International Conference on Solid-State and Integrated Circuit Technology Proceedings; Oct. 21-23, 1998; p. 961; Beijing, China.

Windl et al., "Theory of strain and electronic structure of Si1—yCy and Si1—x—yGexCy alloys", Phys. Rev. B57 (4), pp. 2431-2442 (1998).

Wise et al., Diethyldiethoxysilane as a New Precursor for SiO2 Growth on Silicon; Mat. Res. Soc. Symp. Proc.; 1994; pp. 37-43; vol. 334.

Wolf et al., Process and Equipment Simulation of Copper Chemical Vapor Deposition Using Cu(hfac)vtms; Microelectronic Engineering; 1999; 15-27; 45.

Yagi et al., Substitutional C incorporation into Si1—yCy alloys using novel carbon source, 1,3-disilabutane; Japanese Journal of Applied Physics; 2004; pp. 4153-4154; vol. 43, No. 7A.

\* cited by examiner

STRUCTURE COMPRISES AN AS-DEPOSITED DOPED SINGLE CRYSTALLINE SI-CONTAINING FILM

CROSS-REFERENCE TO RELATED APPLICATIONS

This application is a divisional of U.S. patent application Ser. No. 11/343,244, filed Jan. 30, 2006, now issued as U.S. Pat. No. 7,687,383, which claims priority to U.S. Provisional Application No. 60/649,990, filed Feb. 4, 2005; U.S. Provisional Application No. 60/663,434, filed Mar. 18, 2005; and U.S. Provisional Application No. 60/668,420, filed Apr. 4, 2005; all of which are hereby incorporated by reference in their entireties.

This application is related to, and incorporates by reference in their entireties, the following U.S. patent applications: U.S. patent application Ser. No. 11/343,275, entitled "METHODS OF MAKING SUBSTITUTIONALLY CARBON-DOPED CRYSTALLINE SI-CONTAINING MATERIALS BY CHEMICAL VAPOR DEPOSITION, filed on Jan. 30, 2006 and now issued as U.S. Pat. No. 7,438,760; and U.S. patent application Ser. No. 11/343,264, entitled "SELECTIVE DEPOSITION OF SILICON-CONTAINING FILMS, filed on Jan. 30, 2006 and now issued as U.S. Pat. No. 7,816,236.

BACKGROUND OF THE INVENTION

1. Field of the Invention

This application relates generally to the deposition of silicon-containing materials in semiconductor processing. More particularly, this application relates to the deposition of doped crystalline silicon-containing films using trisilane and incorporating electrically active dopants.

2. Description of the Related Art

The electrical properties of crystalline semiconductors such as silicon (Si), germanium (Ge) and alloys thereof (SiGe) are influenced by the degree to which the materials are doped with Group III and Group V dopants such as boron (B), indium (In), phosphorous (P), arsenic (As) and antimony (Sb). In general, higher levels of doping are generally correlated with lower resistivity. However, in practice doping is complicated by the tendency for the dopant to incorporate non-substitutionally, e.g., interstitially in domains or clusters within the silicon, rather than by substituting for silicon atoms in the lattice structure. Group III and Group V dopants are generally electrically active when incorporated substitutionally, but electrically inactive when incorporated non-substitutionally. Accordingly, doping typically entails extensive activation anneals that cause diffusion and move junctions in a manner that is difficult to control, consuming valuable thermal budget.

Doping of semiconductors with electrically active dopants is of considerable commercial importance in a variety of industrial applications, such as in semiconductor manufacturing, microelectromechanical systems (MEMS) device fabrication, and in flat panel displays. Thus, there is a need for improved methods to incorporate electrically active dopants into semiconductors.

SUMMARY OF THE INVENTION

An embodiment provides a method of depositing a doped crystalline Si-containing film, comprising: providing a substrate disposed within a chamber; intermixing trisilane and a dopant precursor to form a feed gas, the dopant precursor comprising an electrical dopant; contacting the substrate with the feed gas under chemical vapor deposition conditions; and depositing a doped crystalline Si-containing film onto the substrate at a deposition rate of at least about 10 nm per minute, the doped crystalline Si-containing film having a resistivity of about 1.0 mΩ·cm or less. Preferably, the doped crystalline Si-containing film comprises at least about $3 \times 10^{20}$ atoms $cm^{-3}$ of the electrical dopant. In an embodiment, the resistivity of about 1.0 mΩ·cm or less is an as-deposited resistivity.

Another embodiment provides a doped crystalline Si-containing film comprising at least about $3 \times 10^{20}$ atoms $cm^{-3}$ of an n-dopant and having a resistivity of 0.7 mΩ·cm or less. Another embodiment provides an integrated circuit that comprises such a doped crystalline Si-containing film.

These and other embodiments are described in greater detail below.

DETAILED DESCRIPTION OF THE PREFERRED EMBODIMENTS

Figure 1:
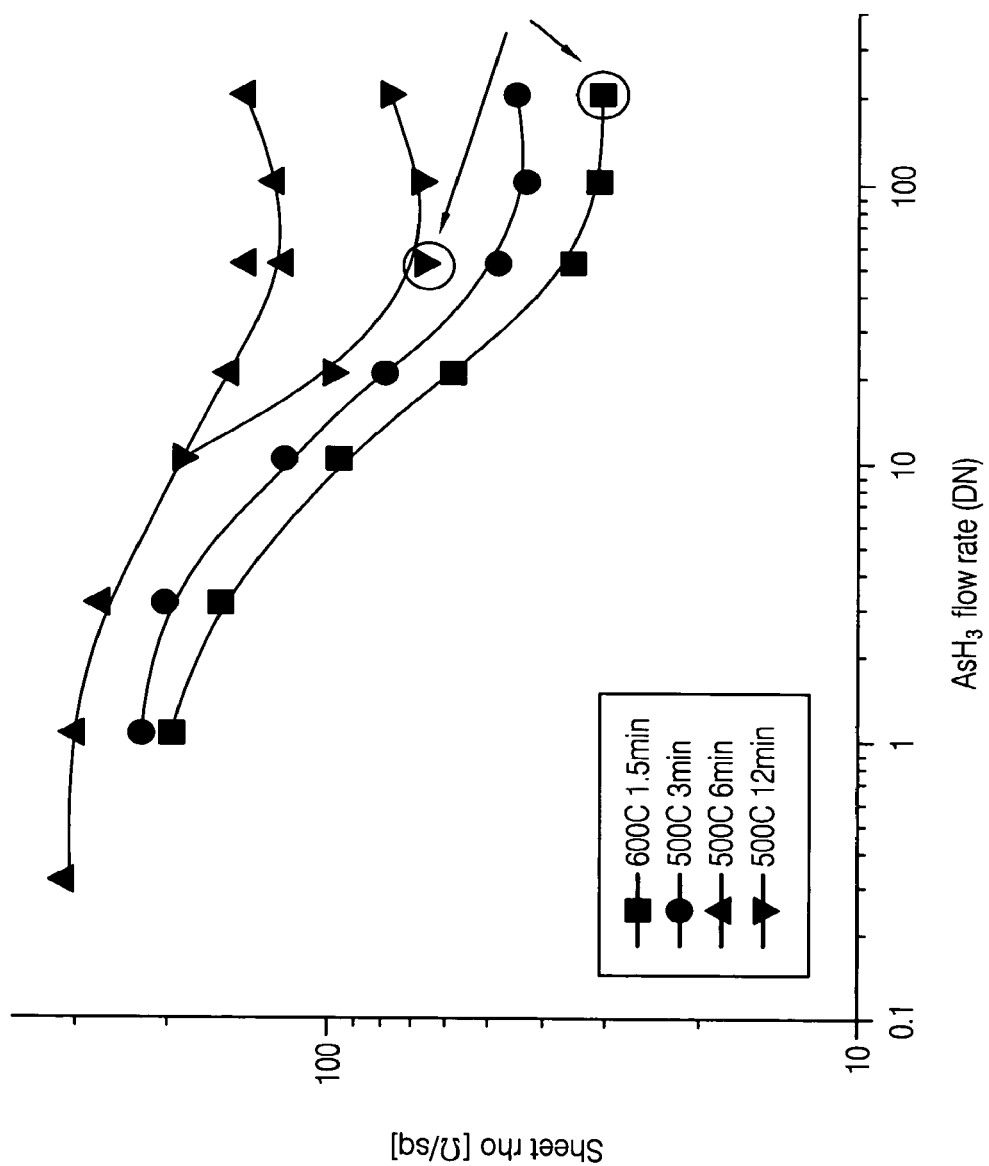
FIG. 1 is a graph of doped silicon film resistivity as a function of dopant precursor (arsine) flow for a series of films deposited using trisilane.

Deposition methods have now been developed that are useful for making a variety of electrically doped crystalline Si-containing materials. For example, crystalline Si and SiGe may be doped to contain relatively high levels of electrically active arsenic by carrying out the deposition at a relatively high deposition rate using trisilane ($H_3SiSiH_2SiH_3$) as a silicon source and arsine ($AsH_3$) as an arsenic source. In preferred embodiments, the dopants in the resulting doped Si-containing material as-deposited are electrically active to a significant degree. For example, the degree of incorporation of an electrically active dopant into a Si-containing material may be about 70% or greater, preferably about 80% or greater, more preferably about 90% or greater, even more preferably about 95% or greater, expressed as the weight percentage of electrically active dopant based on total amount of dopant (electrically active and electrically inactive) in the Si-containing material. The deposition of doped layers in accordance with this aspect can be conducted with or without a carbon source, with or without chlorine gas, selectively or non-selectively, and with or without a $H_2$ carrier gas, as described in greater detail below.

The term "Si-containing material" and similar terms are used herein to refer to a broad variety of silicon-containing materials including without limitation Si (including crystalline silicon), Si:C (e.g., carbon-doped crystalline Si), SiGe and SiGe:C (e.g., carbon-doped crystalline SiGe). As used herein, "carbon-doped Si", "Si:C", "SiGe", "carbon-doped SiGe", "SiGe:C" and similar terms refer to materials that contain the indicated chemical elements in various proportions and, optionally, minor amounts of other elements. For example, "SiGe" is a material that comprises silicon, germanium and, optionally, other elements, e.g., dopants such as carbon and Group III and V dopants. Thus, carbon-doped Si may be referred to herein as Si:C or vice versa. Terms such as "Si:C", "SiGe", and "SiGe:C" are not stoichiometric chemical formulas per se and thus are not limited to materials that contain particular ratios of the indicated elements. The percentage of a dopant (such as carbon, germanium, phosphorous, arsenic or boron) in a Si-containing film is expressed herein in atomic percent on a whole film basis, unless otherwise stated.

Group III dopants are elements in Group III of the periodic table and include B and In. Group V dopants are elements in Group V of the periodic table and include P, As and Sb. The term "Group III/V dopants" is used herein to refer to both, and thus includes B, In, P, As and Sb. Group III/V dopants may be referred to herein as electrical dopants because of their recognized use as semiconductor dopants. However, it will be recognized that such dopants are not always electrically active when incorporated into semiconductors. While this invention is not limited by theory of operation, it is believed that Group III/V dopants are electrically active when incorporated substitutionally into semiconductors, but electrically inactive when incorporated non-substitutionally. The term "n-doped" Si-containing material indicates that the Si-containing material contains a Group V dopant. The term "p-doped" Si-containing material indicates that the Si-containing material contains a Group III dopant. The term "electrically doped" Si-containing material refers to a Si-containing material that is either n-doped or p-doped, and may also be referred to as a "Group III/V doped" Si-containing material.

Various elements (such as carbon, germanium and Group III/V dopants) may be referred to herein as being substitutionally doped into Si-containing materials. Such Si-containing materials may be referred to as being substitutionally doped. The process of incorporating such elements into Si-containing materials may be referred to herein as substitutional doping. Similarly, Group III/V dopants that are substitutionally doped into Si-containing materials may be referred to as having electrically active dopants, and such Si-containing materials may be referred to as being electrically actively doped.

Figure 3:
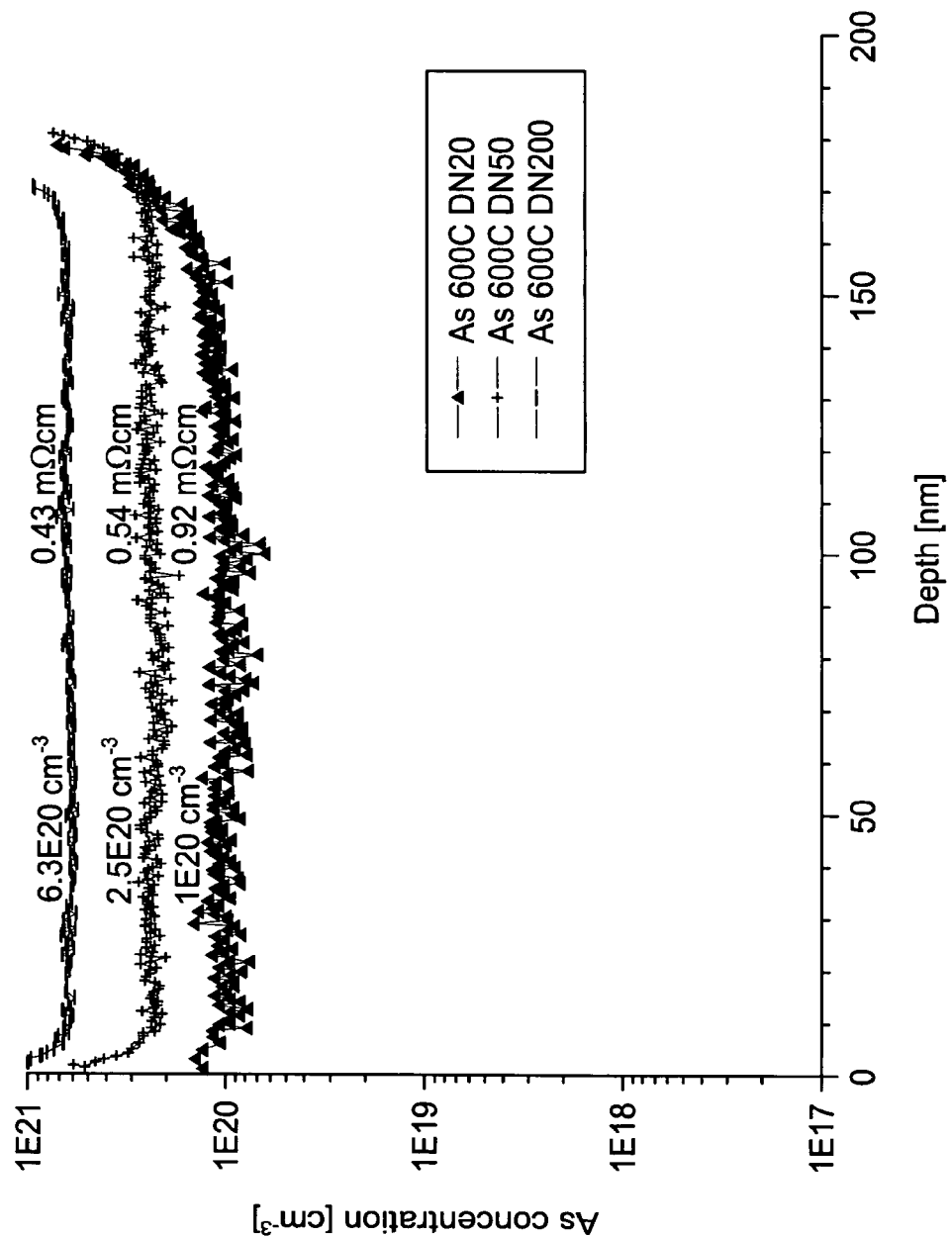
FIG. 3 is a plot of As concentration as a function of depth (by SIMS) for three films deposited using trisilane and arsine at 600° C., at three different arsine flow rates.

Unless otherwise stated, the total amount (substitutional plus non-substitutional) of a Group III/V dopant incorporated into a Si-containing material is determined by secondary ion mass spectrometry (SIMS), and may be expressed herein in units of atoms per cubic centimeter. For example, a Group III/V dopant concentration of $6.3 \times 10^{20}$ atoms per cubic centimeter may be expressed as "6.3 E20 $cm^{-3}$". The amount of the incorporated Group III/V dopant that is electrically active (substitutional) may be determined by electrical resistivity measurements, e.g., four point probe measurements known to those skilled in the art. The amount of carbon substitutionally doped into a Si-containing material may be determined by measuring the perpendicular lattice spacing of the doped Si-containing material by x-ray diffraction, then applying Vegard's law (linear interpolation between single crystal Si and single crystal carbon) in a manner known to those skilled in the art. For example, the amount of carbon substitutionally doped into Si may be determined by measuring the perpendicular lattice spacing of the doped Si by x-ray diffraction, then applying Vegard's law. Those skilled in the art are aware of Vegard's law and the relationships between substitutional carbon level, lattice spacing and strain. See, e.g., Judy L. Hoyt, "Substitutional Carbon Incorporation and Electronic Characterization of $Si_{1-y}C_y/Si$ and $Si_{1-x-y}Ge_xC_y/Si$ Heterojunctions," Chapter 3 in "Silicon Germanium Carbon Alloy," Taylor and Francis, NY, pp. 59-89, 2002. As illustrated in FIG. 3.10 at page 73 of the aforementioned article by Hoyt, the total carbon content in the doped silicon may be determined by SIMS, and the non-substitutional carbon content may be determined by subtracting the substitutional carbon content from the total carbon content. The amount of other elements (such as germanium) substitutionally doped into other Si-containing materials may be determined in a similar manner.

Various embodiments provide methods for depositing electrically doped Si-containing materials (such as single crystalline Si substitutionally doped with boron, arsenic or phosphorous) using a silicon source that comprises trisilane, a Group III/V dopant source and, optionally, source(s) of other elements such as carbon and/or Ge. Under the CVD conditions taught herein, the delivery of trisilane and a Group III/V dopant source to the surface of a substrate preferably results in the formation of an epitaxial electrically doped Si-containing film on the surface of the substrate. In certain selective deposition embodiments described in greater detail below, an etchant source gas (e.g., a halogen-containing gas such as chlorine) is delivered to the substrate in conjunction with the trisilane and Group III/V dopant source, and the Si-containing film is deposited selectively over single crystal substrates or single crystal regions of mixed substrates. Methods employing relatively high deposition rates are preferred, and in certain preferred embodiments such methods have been found to result in the deposition of crystalline Si-containing materials containing relatively high levels of Group III/V dopant.

"Substrate," as that term is used herein, refers either to the workpiece upon which deposition is desired, or the surface exposed to the deposition gas(es). For example, the substrate may be a single crystal silicon wafer, or may be a semiconductor-on-insulator (SOI) substrate, or may be an epitaxial Si, SiGe or III-V material deposited upon such wafers. Workpieces are not limited to wafers, but also include glass, plastic, or any other substrate employed in semiconductor processing. The term "mixed substrate" is known to those skilled in the art, see U.S. Pat. No. 6,900,115 (issued May 31, 2005), entitled "Deposition Over Mixed Substrates," which is hereby incorporated herein by reference in its entirety and particularly for the purpose of describing mixed substrates. As discussed in U.S. Pat. No. 6,900,115, a mixed substrate is a substrate that has two or more different types of surfaces. For example, a mixed substrate may comprise a first surface having a first surface morphology and a second surface having a second surface morphology. In certain embodiments, doped Si-containing layers are selectively formed over single crystal semiconductor materials while minimizing and more preferably avoiding deposition over adjacent dielectrics. Examples of dielectric materials include silicon dioxide, silicon nitride, metal oxide and metal silicate. The terms "epitaxial", "epitaxially" "heteroepitaxial", "heteroepitaxially" and similar terms are used herein to refer to the deposition of a crystalline Si-containing material onto a crystalline substrate in such a way that the deposited layer adopts or follows the lattice constant of the substrate. Epitaxial deposition may be heteroepitaxial when the composition of the deposited layer is different from that of the substrate.

Electrically Doped Si-Containing Films and Methods

An embodiment provides a method of depositing a doped crystalline Si-containing film, comprising: providing a substrate disposed within a chamber; intermixing trisilane and a dopant precursor to form a feed gas, the dopant precursor comprising an electrical active dopant; contacting the substrate with the feed gas under chemical vapor deposition conditions; and depositing a doped crystalline Si-containing film onto the substrate. The film is preferably deposited onto the substrate at a deposition rate of at least about 10 nm per minute, more preferably at least about 20 nm per minute. In an embodiment, the doped crystalline Si-containing film has a resistivity of about 1.0 mΩ·cm or less, preferably about 0.7 mΩ·cm or less, more preferably about 0.5 mΩ·cm or less, even more preferably about 0.4 mΩ·cm or less. The doped crystalline Si-containing film preferably comprises at least about $3\times10^{20}$ atoms $cm^{-3}$, more preferably at least about $4\times10^{20}$ atoms $cm^{-3}$, of the electrical dopant, e.g., an n-dopant or a p-dopant. In an embodiment, the doped crystalline Si-containing contains less than about $3\times10^{19}$ atoms $cm^{-3}$ of an electrically inactive dopant, preferably less than about $2\times10^{19}$ atoms $cm^{-3}$ of an electrically inactive dopant, more preferably less than about $1\times10^{19}$ atoms $cm^{-3}$ of an electrically inactive dopant.

Deposition may be suitably conducted according to the various CVD methods known to those skilled in the art, but the greatest benefits are obtained when deposition is conducted according to the CVD methods taught herein. The disclosed methods may be suitably practiced by employing CVD, including plasma-enhanced chemical vapor deposition (PECVD) or thermal CVD, utilizing trisilane vapor and a dopant precursor to form a feed gas that is contacted with a substrate to deposit a doped crystalline Si-containing film onto the substrate within a CVD chamber. The Si-containing film is a single crystalline (e.g., epitaxial) Si film including electrically active dopants as deposited. In some embodiments, a carbon source added to the feed gas to thereby deposit a crystalline electrically doped Si:C film as the Si-containing film. In some embodiments, a germanium source is added to the feed gas to thereby deposit a crystalline electrically doped SiGe or SiGe:C film as the Si-containing film. In some embodiments, an etchant source gas is added to the feed gas to thereby selectively deposit a crystalline Si-containing film. In the following description, reference may be made to the use of trisilane and a dopant precursor to deposit a doped Si or Si-containing film. It will be recognized that those descriptions are also generally applicable to other Si-containing films, e.g., to the deposition of electrically doped Si:C films (involving the use of a carbon source), to the deposition of electrically doped SiGe and SiGe:C films (involving the use of a germanium source) and to selective depositions (involving the use of an etchant source), unless otherwise stated. Thermal CVD is preferred, as deposition can be achieved effectively without the risk of damage to substrates and equipment that attends plasma processing.

Trisilane and the Group III/V dopant source (along with a germanium source and/or carbon source, in certain embodiments) are preferably introduced to the chamber in the form of gases or by intermixing to form a feed gas. The intermixing to form the feed gas may take place in the chamber or prior to introduction of the feed gas to the chamber. The total pressure in the CVD chamber is preferably in the range of about 0.001 Torr to about 1000 Torr, more preferably in the range of about 0.1 Torr to about 350 Torr, most preferably in the range of about 0.25 Torr to about 100 Torr. Experiments were conducted with pressures ranging from 0.25 Torr to 100 Torr. In some embodiments, the chemical vapor deposition conditions comprise a chamber pressure of at least about 30 Torr, preferably a chamber pressure in the range of about 30 Torr to about 200 Torr. Chamber pressures of about at least about 500 mTorr were suitable in single wafer, single pass, laminar horizontal flow reactor in which the experiments were conducted, as described below. The chamber pressure may be referred to herein as a deposition pressure. The partial pressure of trisilane is preferably in the range of about 0.0001% to about 100% of the total pressure, more preferably about 0.001% to about 50% of the total pressure. The feed gas can also include a gas or gases other than trisilane, such as other silicon sources, dopant precursor(s) and/or inert carrier gases, but preferably trisilane is the sole source of silicon. The term "dopant precursor(s)" is used herein to refer in a general way to various materials that are precursors to various elements (e.g., carbon, germanium, boron, gallium, indium, arsenic, phosphorous, and/or antimony) that may be incorporated into the resulting deposited film in relatively minor amounts. Examples of suitable carrier gases for the methods described herein include He, Ar, $H_2$, and $N_2$. In certain embodiments, the carrier gas is a non-hydrogen carrier such as He, Ar and/or $N_2$ as described in greater detail below. Preferably, trisilane is introduced to the chamber by way of a vaporizer such as a bubbler used with a carrier gas to entrain trisilane vapor, more preferably by way of a delivery system comprising a bubbler and a gas concentration sensor that measures the amount of trisilane in the carrier gas flowing from the bubbler. Such sensors are commercially available, e.g., Piezocon® gas concentration sensors from Lorex Industries, Poughkeepsie, N.Y., U.S.A.

Incorporation of electrically active dopants into Si-containing films by CVD using trisilane is preferably accomplished by in situ doping using Group III/V dopant sources or Group III/V dopant precursors. Preferred precursors for Group III/V dopants are dopant hydrides, including p-type dopant precursors such as diborane and deuterated diborane, and n-type dopant precursors such as phosphine, arsenic vapor, and arsine. Silylphosphines, e.g., $(H_3Si)_{3-x}PR_x$, and silylarsines, e.g., $(H_3Si)_{3-x}AsR_x$, where x=0-2 and $R_x$=H and/or deuerium (D), are alternative dopant precursors for phosphorous and arsenic dopants. $SbH_3$ and trimethylindium are examples of dopant precursors for antimony and indium, respectively. Such dopant precursors are useful for the preparation of preferred films as described below, preferably silicon, Si:C, SiGe and SiGe:C films and alloys that are substitutionally doped with boron, phosphorous, antimony, indium, or arsenic.

Examples of suitable carbon sources that may be included in the feed gas include without limitation silylalkanes such as monosilylmethane, disilylmethane, trisilylmethane, and tetrasilylmethane and/or alkylsilanes such as monomethyl silane (MMS) and dimethyl silane. In some embodiments, a carbon source comprises $H_3Si—CH_2—SiH_2—CH_3$ (1,3-disilabutane). The feed gas may also contain other materials known by those skilled in the art to be useful for doping or alloying Si-containing films, as desired, such as a supplemental silicon source and/or germanium source. Specific examples of such sources include: silane, disilane and tetrasilane as supplemental silicon sources; germane, digermane and trigermane as germanium sources; and monosilylmethane, disilylmethane, trisilylmethane, tetrasilylmethane, monomethyl silane (MIMS), and dimethyl silane as sources of both carbon and silicon.

A suitable manifold may be used to supply feed gas(es) to the CVD chamber. The CVD chamber is preferably a single wafer reactor, e.g., a single wafer, horizontal gas flow CVD chamber as described in the illustrated embodiments. Most preferably, the CVD chamber is a single-wafer, single pass, laminar horizontal gas flow reactor, preferably radiantly heated. Suitable reactors of this type are commercially available, and preferred models include the Epsilon™ series of single wafer reactors commercially available from ASM America, Inc. of Phoenix, Ariz. The methods described herein can also be employed in alternative reactors, such as a showerhead arrangement. However, benefits in increased uniformity and deposition rates have been found particularly effective in the horizontal, single-pass laminar gas flow arrangement of the Epsilon™ chambers, employing a rotating substrate, particularly with low process gas residence times. CVD may be conducted by introducing plasma products (in situ or downstream of a remote plasma generator) to the chamber, but as noted above, thermal CVD is preferred.

The amount of dopant precursor(s) in the feed gas may be adjusted to provide the desired level of dopant(s) in the Si-containing film. Preferred concentrations of dopant precursor in the feed gas are in the range of about 1 part per billion (ppb) to about 20% by weight based on the total weight of reactive gas (excluding inert carrier and diluent gases). For Group III/V dopants, preferred concentrations of dopant precursor (e.g., pure phosphine, arsine or diborane, or equivalent diluted phosphine, arsine or diborane) in the feed gas are preferably between about 0.1 standard cubic centimeters per minute (sccm) to about 5 sccm, although higher or lower amounts are sometimes preferred in order to achieve the desired property in the resulting film. In the preferred Epsilon™ series of single wafer reactors, dilute mixtures of the Group III/V dopant precursor in a carrier gas can be delivered to the reactor via a mass flow controller with set points ranging from about 10 sccm to about 1000 sccm, depending on desired dopant concentration and dopant gas concentration. Dilution of Group III/V dopant gases can lead to factors of $10^{-7}$ to $10^{-2}$ to arrive at equivalent pure dopant flow rates. Typically commercially available dopant sources are Group III/V dopant hydrides diluted in $H_2$. However, as described below with respect to FIG. 18, in some embodiments dopant precursors are diluted in a non-hydrogen inert gas. The dilute mixture is preferably further diluted by mixing with trisilane, an etchant source such as chlorine (for selective deposition embodiments), any suitable carrier gas, and any other desired dopant precursor for substitutional doping, such as a strain-influencing precursor (e.g., germanium source such as germane or carbon source such as MMS). Since typical total flow rates for deposition in the preferred Epsilon™ series reactors often range from about 20 standard liters per minute (slm) to about 180 slm, the concentration of the Group III/V dopant precursor used in such a method is generally small relative to total flow.

The relative amounts of the various feed gas components may be varied over a broad range depending on the composition desired for the resulting Si-containing film and the deposition conditions employed (e.g., temperature, pressure, deposition rate, etc.), and may be determined by routine experimentation in view of the guidance provided herein. The feed gas components may be intermixed and then delivered to the chamber or substrate, or the feed gas may be formed by mixing the components at or near the substrate, e.g., by supplying the feed gas components to the CVD chamber separately.

Thermal CVD is preferably conducted at a substrate temperature that is effective to deposit a crystalline Si-containing film over the substrate. Preferably, thermal CVD is conducted at a temperature in the range of about 350° C. to about 900° C., more preferably about 500° C. to about 800° C. In an embodiment, the chemical vapor deposition conditions comprise a temperature that is at about a transition temperature between substantially mass-transport controlled deposition conditions and substantially kinetically controlled deposition conditions for trisilane. Such trisilane deposition conditions are described in U.S. Pat. No. 6,821,825, which is hereby incorporated by reference and particularly for the purpose of describing trisilane deposition conditions. PECVD is preferably conducted at a temperature in the range of about 300° C. to about 700° C. Those skilled in the art can adjust these temperature ranges to take into account the realities of actual manufacturing, e.g., preservation of thermal budget, deposition rate, different sizes of chambers, including single wafer and batch reactors, preferred total pressures and partial pressures etc. In general, higher partial pressures entail lower temperatures for a given desired result, whether it be deposition rate, layer quality or a combination of the two. The substrate can be heated by a variety of methods known in the art, e.g., resistive heating and lamp heating.

Various deposition parameters have been found to affect the incorporation of electrically active dopants into Si-containing films, including: the ratio of trisilane to other silicon sources; the ratio of Group III/V dopant precursor flow rate to trisilane flow rate; the carrier gas flow rate; the deposition pressure; the deposition temperature; and the deposition rate. Surprisingly, it has been found that certain combinations of these parameters are particularly advantageous for achieving relatively high levels of electrically active dopant incorporation into Si-containing films as deposited. In particular, the following combinations are preferred:

A relatively high trisilane flow rate (e.g., greater than about 50 mg/min for a single wafer deposition reactor) in combination with at least one of the following: a relatively low flow rate for supplemental silicon sources (e.g., a relatively high ratio of trisilane flow rate to silane flow rate); a relatively low carrier gas flow rate (e.g., a relatively high ratio of trisilane flow rate to hydrogen carrier gas flow rate); a relatively high deposition rate (e.g., preferably at least about 5 nm per minute, more preferably at least about 10 nm per minute, even more preferably at least about 20 nm per minute); a relatively high deposition pressure (e.g., preferably at least about one Torr); a relatively low deposition temperature (e.g., preferably in the range of from about 450° C. to about 650° C.); and a relatively high ratio of Group III/V dopant precursor flow rate to trisilane flow rate (e.g., preferably a diluted arsine (1% in carrier gas) to trisilane flow rate ratio of at least about 0.1 scc/mg).

A relatively high deposition pressure (e.g., at least about 1 Torr) in combination with at least one of the following: a relatively low carrier gas flow rate (e.g., about 1 slm to about 50 slm); a relatively high trisilane flow rate (e.g., about 100 mg/min to about 500 mg/min); a relatively high deposition rate (e.g., greater than about 5 nm/min, more preferably at least about 20 nm per minute); and a relatively low deposition temperature (e.g., preferably in the range of from about 450° C. to about 650° C.).

FIGS. 1-5 illustrate the effects of various combinations of deposition parameters. The data shown in FIGS. 1-5 was obtained for thermal chemical vapor depositions conducted in an Epsilon™ single wafer reactor (commercially available from ASM America, Inc. of Phoenix, Ariz.) using 1% arsine in $H_2$ as an arsenic precursor to deposit a series of silicon films substitutionally doped with arsenic onto a single crystal silicon substrate.

FIG. 1 is a graph of doped silicon film resistivity as a function of dopant precursor (arsine) flow for a series of films deposited using trisilane. The trisilane flow rate was fixed at 50 mg/minute and the arsine flow rate on the x-axis is in units of standard cubic centimeters per minute (sccm) for 1% arsine in $H_2$ (referred to as "dopant number" or "DN" herein). The resistivity values (y-axis, units of $\Omega$/sq) were obtained directly from four-point probe measurements on the deposited films and thus are uncorrected for film thickness. FIG. 1 illustrates the general proposition that film resistivity as a function of arsine flow goes through a minimum, and thus that decreases in resistivity are not necessarily achieved by merely increasing the flow rate of the dopant precursor. This invention is not bound by theory, but it is believed that the increasing resistivity at higher dopant precursor flow rates may be due to the incorporation of an increasing fraction of electrically inactive dopant in the film as arsine flow increased (for a fixed trisilane flow rate).

Figure 2A:
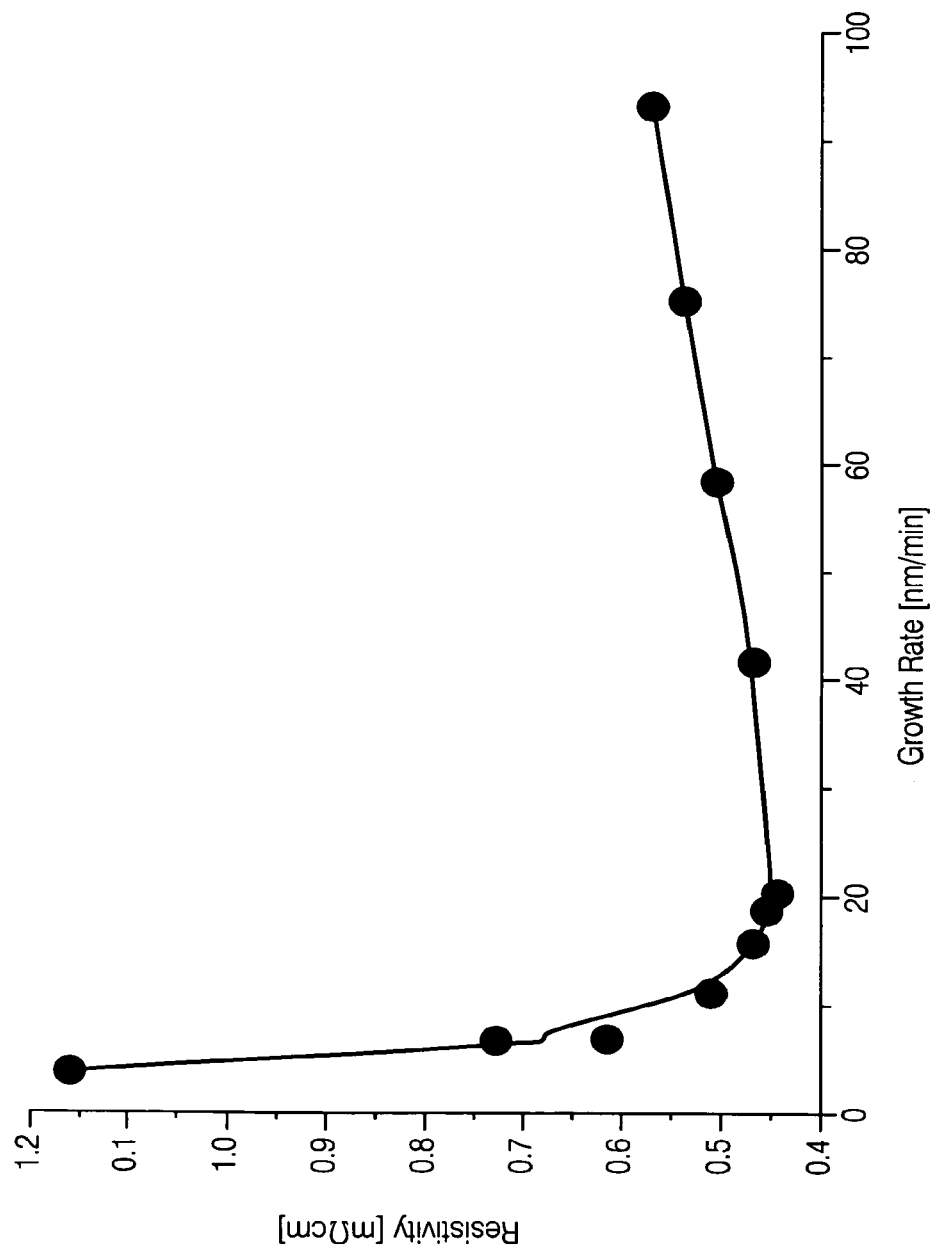
FIG. 2A is a graph of arsenic-doped Si film resistivity as a function of growth rate for a series of films deposited at a constant flow rate ratio of trisilane to arsine.
Figure 2B:
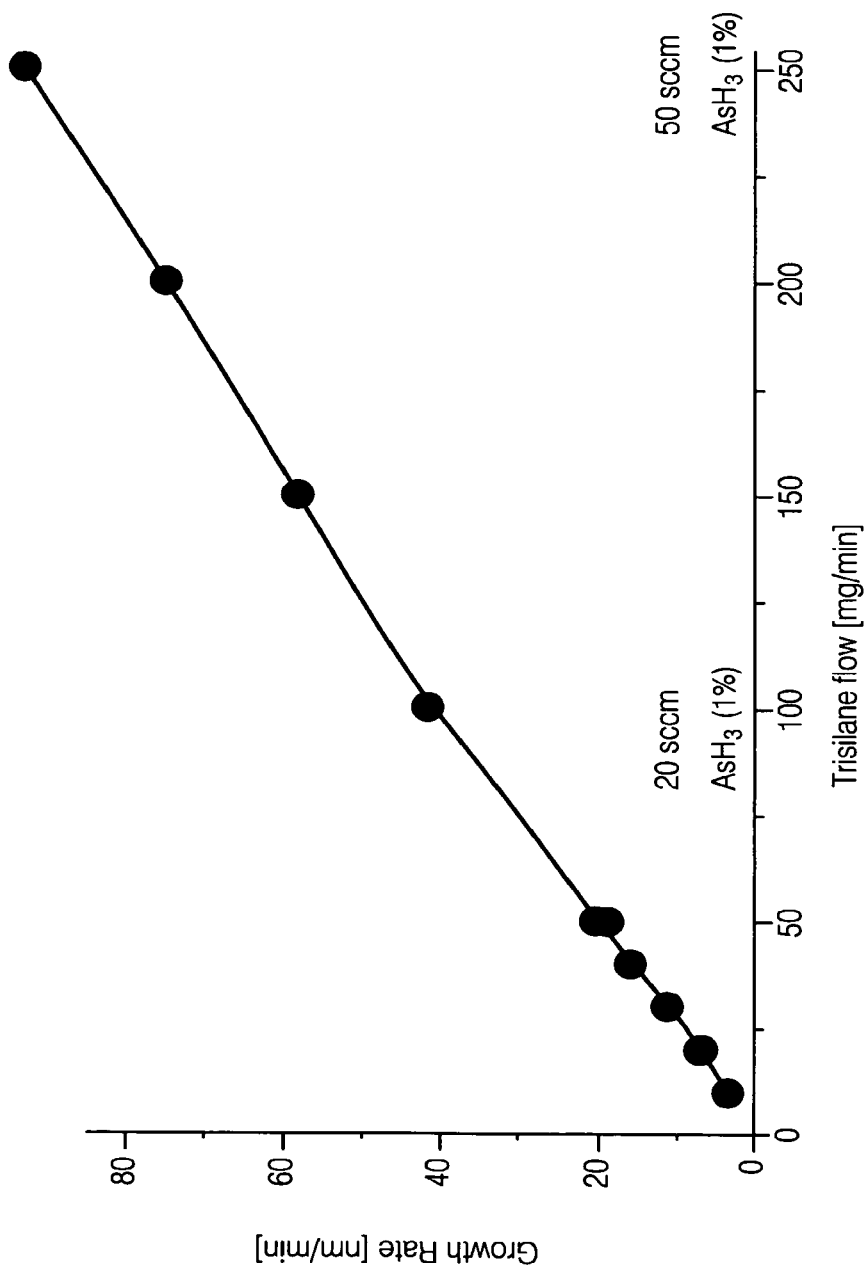
FIG. 2B is a plot of film deposition rate as a function of trisilane flow rate, at a constant flow rate ratio of trisilane to arsine.

FIG. 2A is a plot of arsenic-doped silicon film resistivity as a function of growth rate for a series of films deposited at a constant flow rate ratio of diluted arsine (1% $AsH_3$ in hydrogen) to trisilane of about 0.2 scc/mg, at a deposition temperature of about 550° C. FIG. 2B is a plot of film deposition rate as a function of trisilane and arsine flow rate at the same constant flow rate ratio. FIGS. 2A and 2B demonstrate that silicon film resistivity values of about 1.0 m$\Omega$·cm or less may be achieved using trisilane by conducting the depositions at a relatively high rate, e.g., at least about 5 nm per minute, more preferably at least about 10 nm per minute. As illustrated in FIG. 2B, the growth rate of electrically doped silicon films is a substantially linear function of the flow rate of trisilane and the diluted Group III/V dopant precursor (1% $AsH_3/H_2$ in the illustrated embodiment), and thus the growth or deposition rate may be controlled by manipulating the trisilane flow rate. The silicon film resistivity values may also be controlled by manipulating the trisilane flow rate, e.g., to obtain silicon film resistivity values of about 1.0 m$\Omega$·cm or less, about 0.7 m$\Omega$·cm or less, or about 0.5 m$\Omega$·cm or less, as illustrated in FIG. 2A. Relatively high flow rate ratios of the Group III/V dopant precursor (arsine in the illustrated embodiment) to trisilane are preferred. For example, the flow rate ratio of a dopant precursor (diluted to 1% in a carrier gas) to trisilane is preferably at least about 0.1 scc/mg, more preferably at least about 0.2 scc/mg, even more preferably at least about 0.3 scc/mg. Those skilled in the art may make appropriate flow rate adjustments for other Group III/V dopant precursor dilutions.

FIG. 3 is a plot of As concentration as a function of depth (by SIMS) for three films deposited using trisilane (50 mg/min) and diluted arsine (1% in $H_2$) at a deposition temperature of 600° C. (growth rate of 120 nm/min) at three different arsine flow rates (DN's of 20, 50 and 200). As indicated in FIG. 3, the As concentration in the film was 1 E20 $cm^{-3}$ (resistivity of 0.92 m$\Omega$·cm) at the lowest flow rate (DN=20), increasing to 2.5 E20 $cm^{-3}$ (resistivity of 0.54 m$\Omega$·cm) at a higher flow rate (DN=50) and increasing still further to 6.3 E20 $cm^{-3}$ (resistivity of 0.43 m$\Omega$·cm) at the highest flow rate (DN=200).

Figure 4:
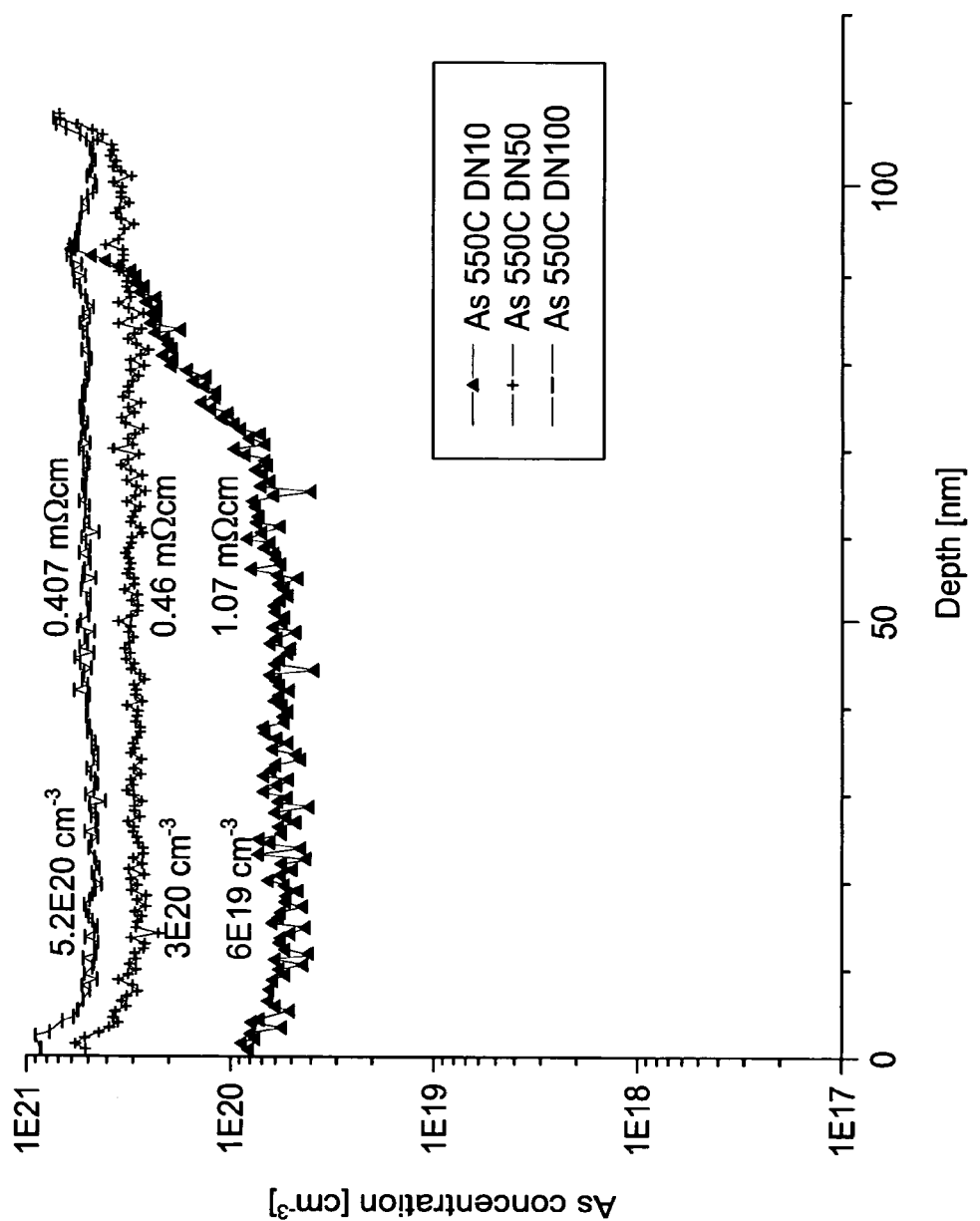
FIG. 4 is a plot of As concentration as a function of depth (by SIMS) for three films deposited using trisilane and arsine at 550° C., at three different arsine flow rates.

FIG. 4 is a plot of As concentration as a function of depth (by SIMS) for three films deposited using trisilane (50 mg/min) and diluted arsine (1% in $H_2$) at a deposition temperature of 550° C. (growth rate of 36 nm/min) at three different arsine flow rates (DN's of 10, 50 and 100). As indicated in FIG. 4, the As concentration in the film was 6 E19 $cm^{-3}$ (resistivity of 1.07 m$\Omega$·cm) at the lowest flow rate (DN=10), increasing to 3 E20 $cm^{-3}$ (resistivity of 0.46 m$\Omega$·cm) at a higher flow rate (DN=50) and increasing still further to 5.2 E20 $cm^{-3}$ (resistivity of 0.41 m$\Omega$·cm) at the highest flow rate (DN=100).

FIGS. 3 and 4 illustrate that the combination of a relatively high growth rate (resulting from a relatively high trisilane flow rate) in combination with a relatively high Group III/V dopant precursor flow rate results in very high levels of in situ substitutional Group III/V dopant incorporation into the Si-containing film. In preferred embodiments, substitutional Group III/V dopant levels in Si-containing films are about $1 \times 10^{20}$ atoms $cm^{-3}$ or higher, more preferably about $3 \times 10^{20}$ atoms $cm^{-3}$ or higher, even more preferably about $4 \times 10^{20}$ atoms $cm^{-3}$ or higher. Resistivity values for doped crystalline Si-containing films (e.g., doped epitaxial Si films) are preferably about 1.0 m$\Omega$·cm or less, more preferably about 0.7 m$\Omega$·cm or less, even more preferably about 0.5 m$\Omega$·cm or less, most preferably about 0.4 mΩ·cm or less. This invention is not bound by theory, but it is believed that the use of trisilane as described herein enables are very high fraction of the electrical dopant to be incorporated substitutionally into the silicon, thus minimizing the incorporation of electrically inactive species. Preferred doped crystalline Si-containing films contain less than about $3\times10^{19}$ atoms $cm^{-3}$ of an electrically inactive dopant, more preferably less than about $3\times10^{19}$ atoms $cm^{-3}$ of an electrically inactive dopant, even more preferably less than about $1\times10^{19}$ atoms $cm^{-3}$ of an electrically inactive dopant.

Figure 5:
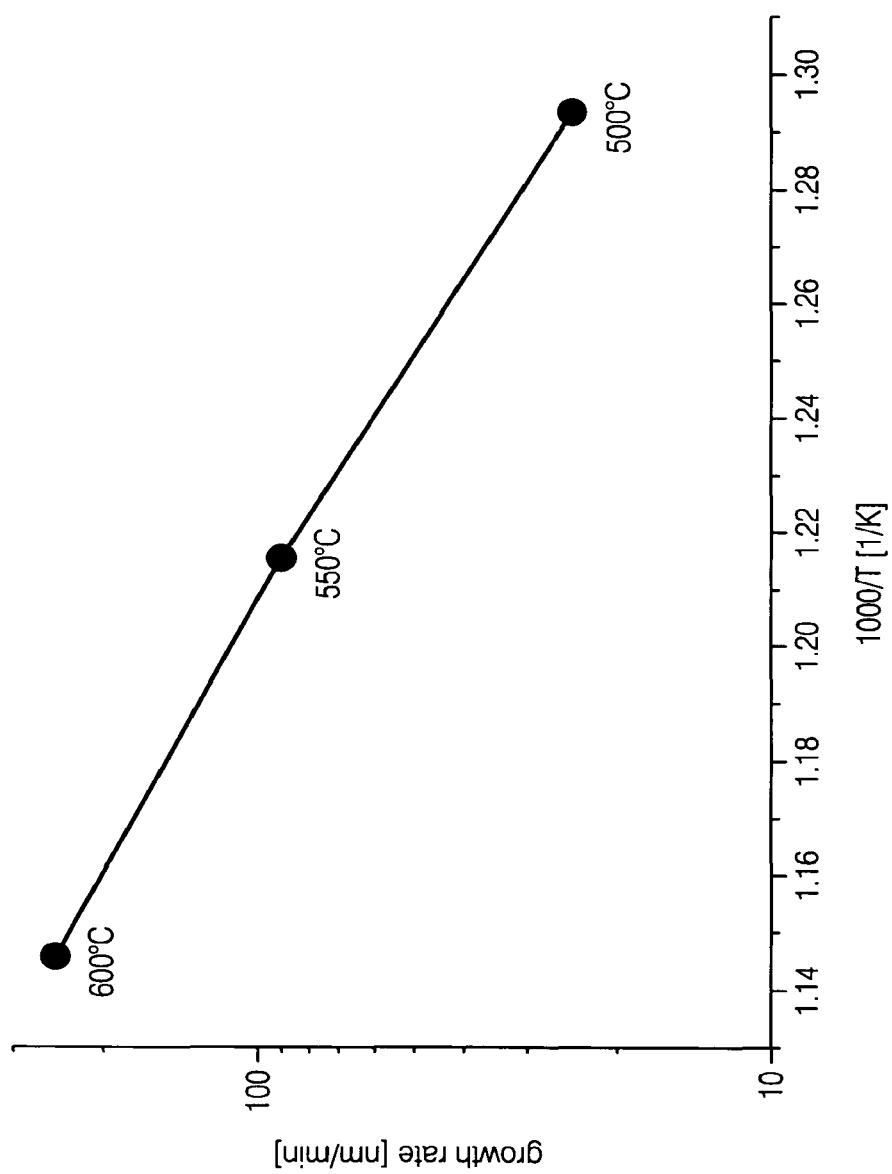
FIG. 5 is a plot illustrating the effect of deposition temperature on growth rate for a series of silicon films deposited using trisilane and arsine.

FIG. 5 is a plot illustrating the effect of deposition temperature on growth rate for a series of silicon films deposited using trisilane and arsine. The flow rate of the trisilane was relatively high, about 200 mg/min. The other deposition parameters (e.g., arsine flow rate, deposition pressure and carrier gas flow rate) were controlled so that all of the resulting As-doped films contained about the same amount of substitutional As (about 5E20 $cm^{-3}$). As indicated in FIG. 5, high growth rates and high levels of substitutional As incorporation were obtained at relatively low deposition temperatures over the range of 500° C. to 600° C. Within that temperature range, higher growth rates were observed at higher deposition temperatures. FIG. 5 illustrates that the combination of relatively high trisilane flow rates and relatively low deposition temperatures results in high growth rates and very high levels of in situ substitutional Group III/V dopant incorporation into Si-containing films as deposited. Thus, the use of trisilane as described herein, e.g., to deposit in situ doped single crystalline Si-containing films, allows thermal budgets to be conserved by reducing the deposition temperature and by reducing or eliminating dopant activation anneals.

As mentioned above, the aforementioned electrically-doped single crystalline Si-containing films may further comprise another substitutional dopant, e.g., a strain-modifying substitutional dopant such as carbon and/or germanium. In general, the presence of substitutional carbon results in scattering that tends to increase resistivity, as compared to an otherwise similar electrically-doped single crystalline Si-containing film that does not contain substitutional carbon. However, when deposited using trisilane as described herein, it has been found that such electrically-doped single crystalline Si-containing films may still have surprisingly low resistivities, despite the presence of the carbon. For example, when doped with an electrically active dopant, the crystalline Si-containing films comprising substitutional carbon may have a resistivity of about 1.0 mΩ·cm or less, preferably about 0.7 mΩ·cm or less. In experiments, a lattice spacing of about 5.323 Å (as measured by X-ray diffraction) has now been achieved for arsenic-doped Si:C deposited from trisilane, arsine and MMS. This lattice spacing of 5.323 Å corresponds to a substitutional carbon level of about 3.25%.

Figure 6A:
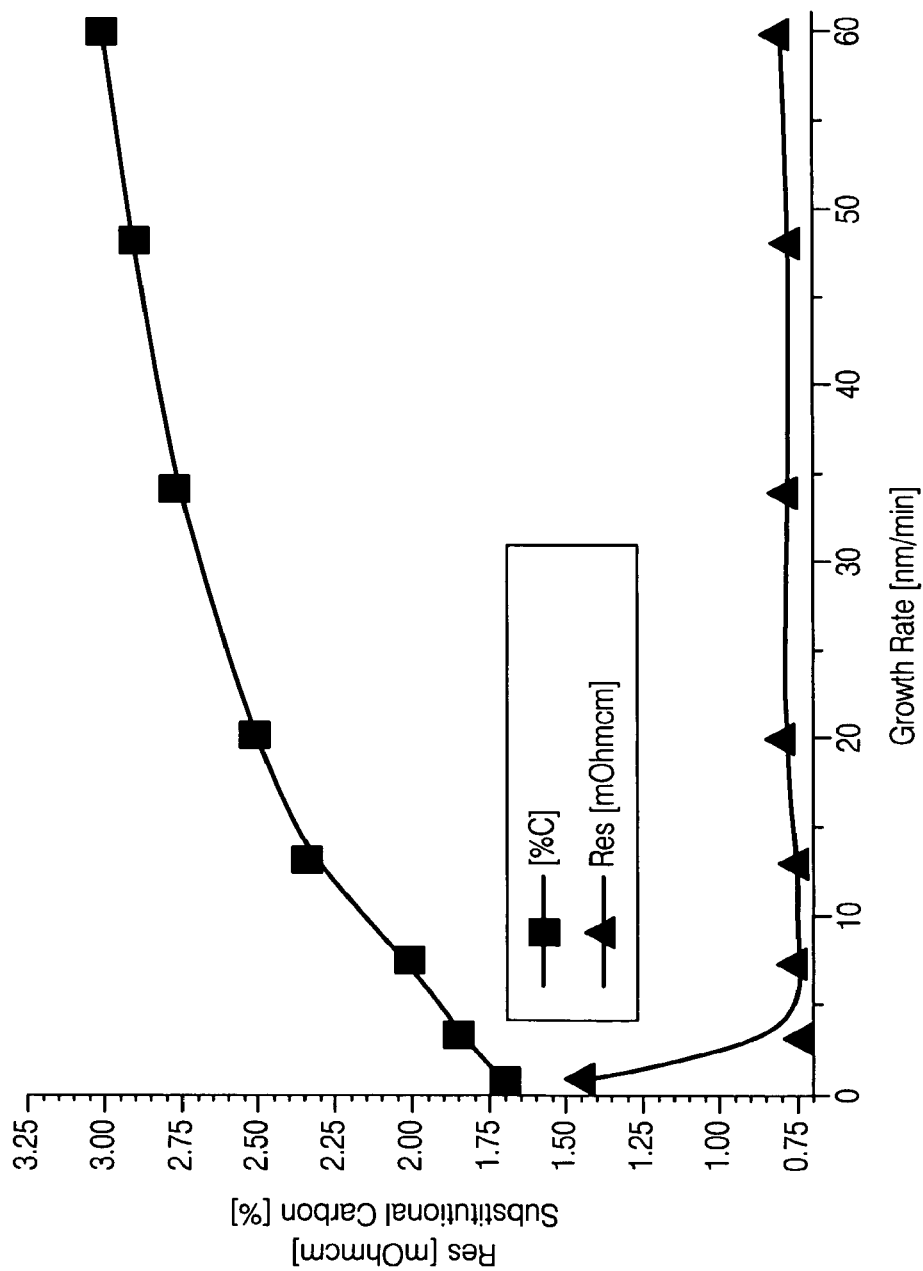
FIG. 6A shows a graph of substitutional carbon content as a function of growth rate for silicon films substitutionally doped with both carbon and arsenic. The graph also shows the resistivity of those films (units of mΩ·cm, also left axis).

For example, FIG. 6A is a graph showing percent substitutional carbon as a function of growth rate (nm/min) for silicon films substitutionally doped with both carbon and arsenic. FIG. 6A also shows the resistivity of those films (units of mΩ·cm, also left axis). FIG. 6A demonstrates that Si-containing films may be deposited that contain various levels of substitutional carbon (e.g., about 1.7 atomic % to about 3.25 atomic % in the illustrated embodiments) and that contain various amounts of an electrically active dopant (arsenic in the illustrated embodiment). The combination of the electrically active dopant and the substitutional carbon produces films having desirably low resistivity values (e.g., about 0.7 mΩ·cm to about 1.45 mΩ·cm in the illustrated embodiments).

Figure 6B:
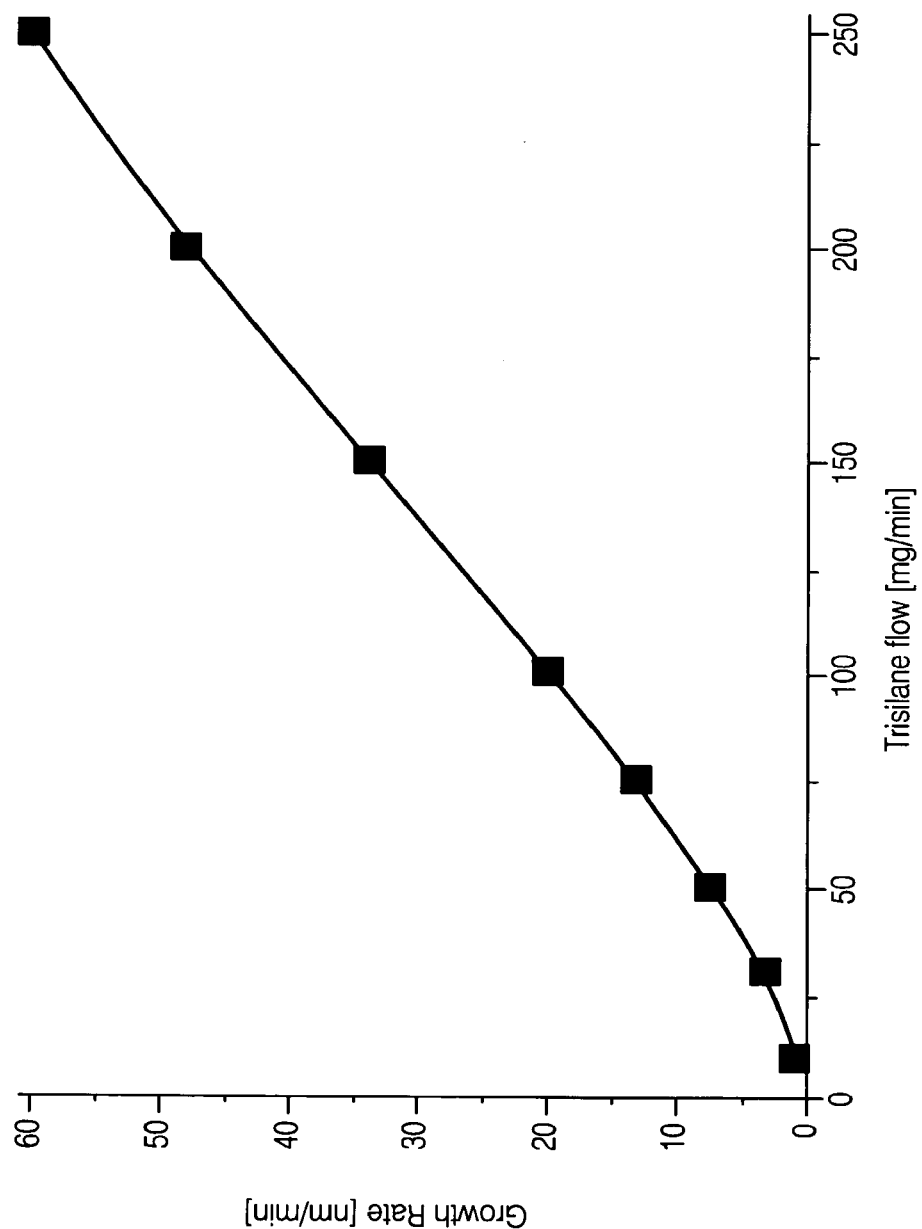
FIG. 6B is a plot showing the growth rate of those films as a function of trisilane flow rate.

FIG. 6B shows the growth rate of electrically-doped Si:C films as a function of trisilane flow rate (mg/min). The plots shown in FIGS. 6A-6B demonstrate that high levels of substitutional carbon and low resistivities may be achieved using trisilane by carrying out the depositions at a relatively high deposition or growth rate, e.g., at least about 5 nm/min. As illustrated in FIG. 6B, the growth rates may be controlled, e.g., by controlling the trisilane flow rates and deposition temperatures, to produce electrically doped crystalline Si-containing films that comprise various levels of carbon, e.g., 2.5% or greater substitutional carbon, preferably 2.6% or greater substitutional carbon, more preferably 2.7% or greater substitutional carbon. In some embodiments, the electrically doped crystalline Si-containing films may comprise even higher levels of carbon, e.g., 2.8% or greater substitutional carbon, preferably 2.9% or greater substitutional carbon, more preferably 3.0% or greater substitutional carbon, as indicated in FIG. 6. The crystalline Si-containing films are preferably single crystalline, e.g., epitaxial. The data shown in FIGS. 6A-6B was obtained by maintaining the relative flow rates of arsine, carbon source (MIMS) and diluted arsine (1% in $H_2$) at a constant level, relative to one another. Thus, in these embodiments, growth rate was controlled by increasing the trisilane flow rate, while increasing the flow rates of MMS and arsine to maintain a fixed trisilane:MMS:arsine flow rate ratio.

Electrically doped crystalline Si-containing films comprising relatively high levels of substitutional carbon (e.g., films comprising 2.4% or greater substitutional carbon) may exhibit various levels of tensile stress because the substitutional carbon atoms are smaller than the silicon atoms that they replace in the crystalline silicon lattice structure. In an embodiment, an electrically doped single crystalline silicon film comprising 2.4% or greater substitutional carbon has a tensile stress of about 1.0 GPa or greater, e.g., about 1.5 GPa or greater, preferably about 1.7 GPa or greater, more preferably about 1.85 GPa or greater, even more preferably about 2.0 GPa or greater. The stress may be determined in any particular direction within the film. For example, for overlying silicon films comprising substitutional carbon that are deposited onto underlying crystalline silicon substrates, the overlying silicon film may exhibit a perpendicular stress (i.e., stress measured perpendicular to the film/substrate interface) that is different from the parallel stress (i.e., stress measured parallel to the film substrate interface). See, e.g., FIG. 3.1 at page 62 of the aforementioned article by Hoyt.

Stress may also be introduced by heteroepitaxial deposition of the electrically doped Si:C film onto a suitable substrate. For example, an arsenic-doped Si:C film having a substitutional carbon level of about 3.25 atomic % (lattice spacing of 5.323 Å) may be deposited onto a single crystal silicon substrate. When constrained to such a template (having a lattice spacing of about 5.43 Å), the tensile stress in such a Si:C film amounts to 2.06 GPa. The stress may be varied by appropriate selection of the substrate and the amount of substitutional carbon in the Si:C film. In various embodiments, the stress produced in a electrically doped Si:C film is preferably between 1 GPa and 3 GPa. When the electrically doped Si:C is deposited to less than the critical thickness of the material, the deposited layer remains tensile stressed. In an embodiment, an electrically doped Si:C or SiGe film is configured to exert a strain on an adjacent layer. For example, a compressive strain may be exerted on a silicon film that is deposited onto an electrically doped relaxed Si:C layer. In an embodiment, an electrically doped Si:C film formed in a recessed source/drain region exerts a tensile strain on a silicon channel formed between the source and drain, as described in greater detail below. Such configurations may be used in various applications, e.g., to improve electron mobility for NMOS devices.

Figure 7:
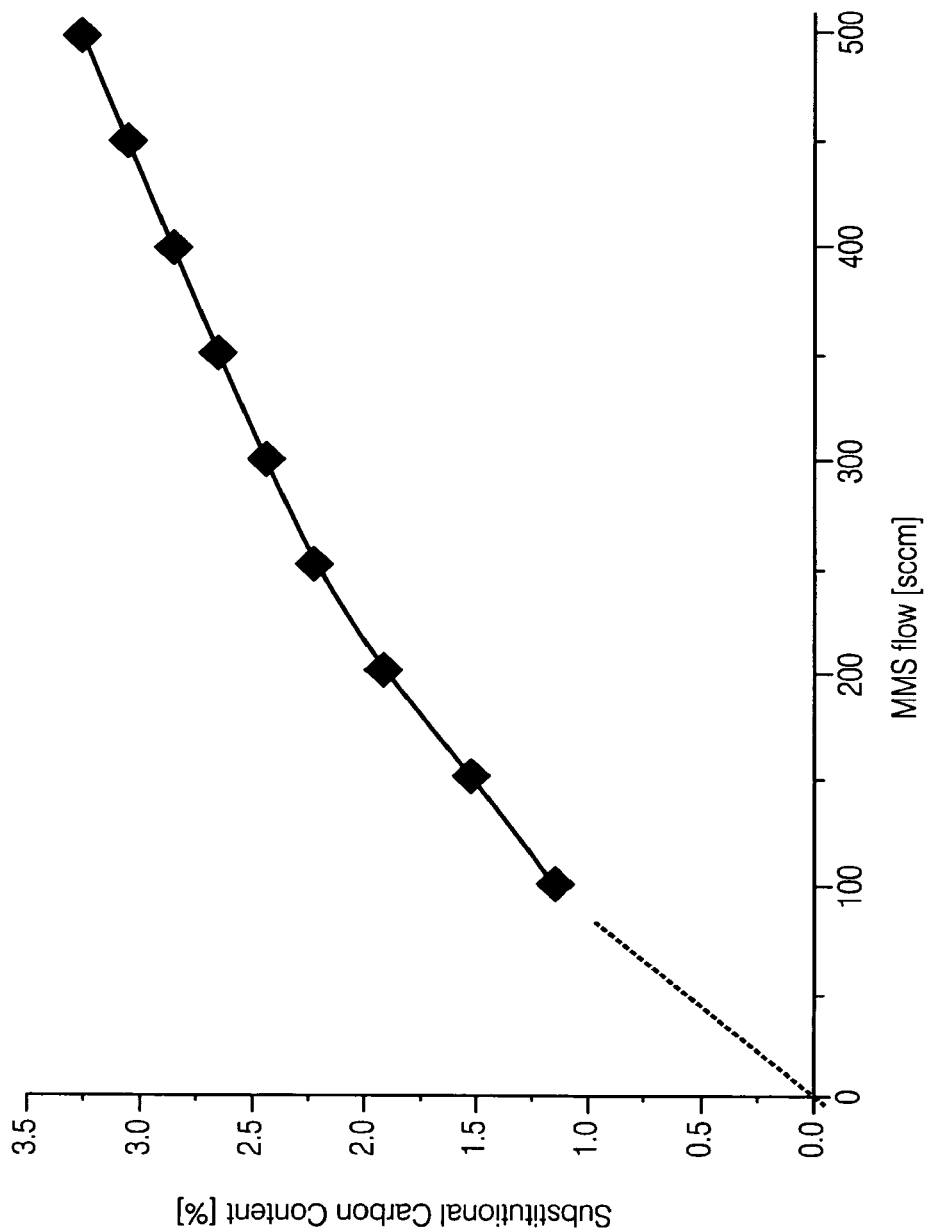
FIG. 7 shows a graph of substitutional carbon content in an arsenic-doped Si:C film as a function of monomethylsilane (MMS) flow rate, at a constant trisilane flow rate and at a constant arsine flow rate.

FIG. 7 shows a graph of substitutional carbon content in an arsenic-doped Si:C film as a function of MMS flow rate, at a constant trisilane flow rate (200 mg/min) and at a constant arsine flow rate (100 sccm). The data plotted in FIG. 7 shows that higher substitutional carbon levels are obtained at higher MMS flow rates under these conditions. Because the trisilane flow rate was constant and the carbon source (MMS) flow rate was varied, FIG. 7 illustrates the effect on substitutional carbon content of varying the flow rate ratio of carbon source to trisilane. As the flow rate ratio of MMS to trisilane increased, the amount of substitutional carbon in the resulting film increased relatively linearly.

Figure 8:
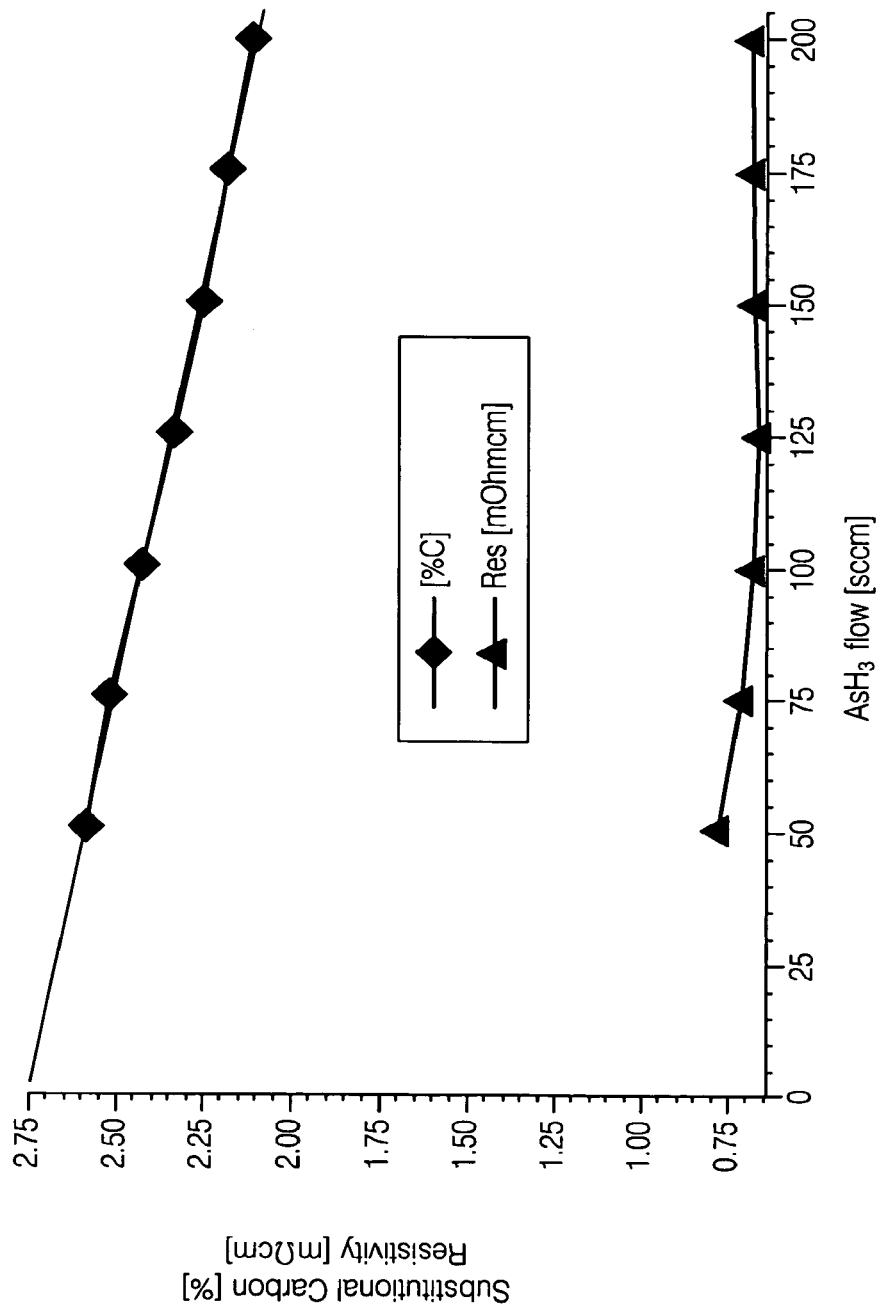
FIG. 8 shows a graph of substitutional carbon content and resistivity as a function of arsine flow rate for the deposition of an arsenic-doped Si:C film at a constant trisilane flow rate and at a constant MMS flow rate.

FIG. 8 shows a graph of substitutional carbon content and resistivity as a function of diluted arsine flow rate (1% in $H_2$) for the deposition of an arsenic-doped Si:C film at a constant trisilane flow rate (200 mg/min) and at a constant MMS flow rate (300 sccm). The data plotted in FIG. 8 demonstrates that relatively high substitutional carbon levels (greater than about 2.0% for the illustrated embodiments) and relatively low resistivities (less than about 0.8 mΩ·cm in the illustrated embodiments) may be obtained over a broad range of arsine flow rates.

Figure 9A:
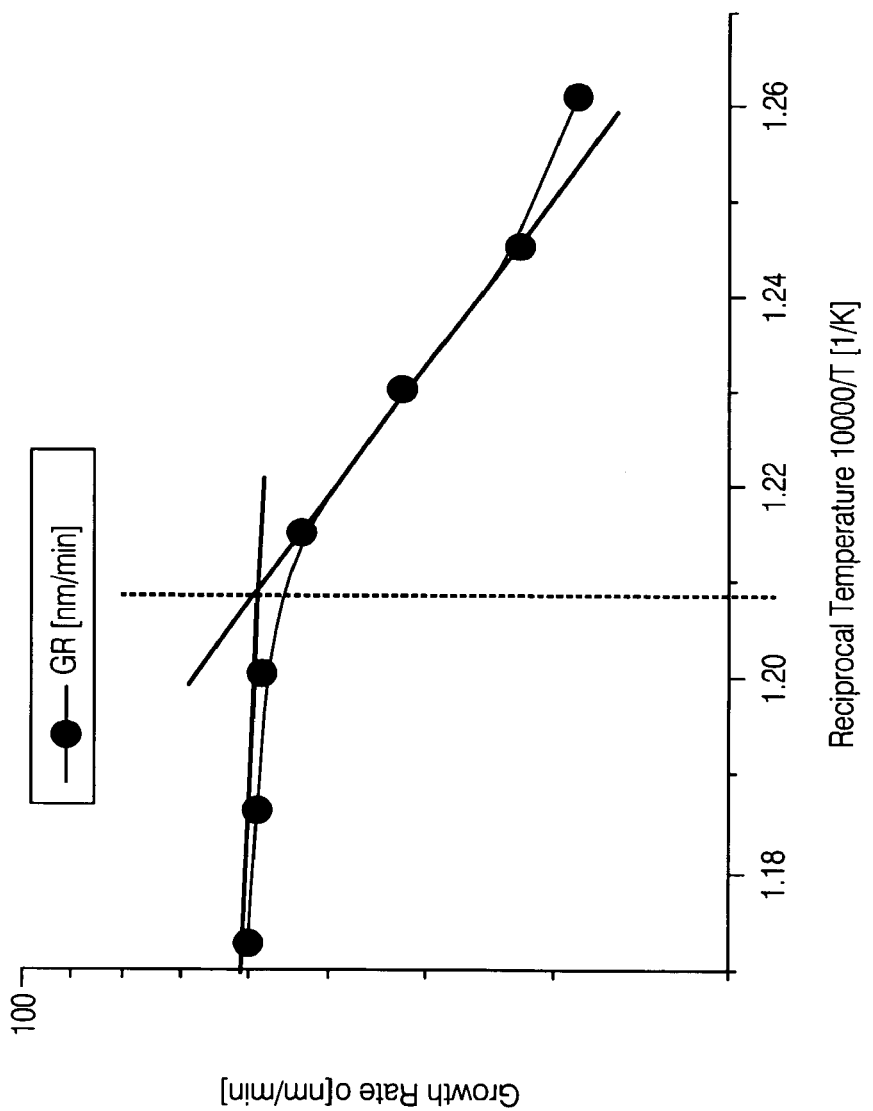
FIGS. 9A-9D illustrate the effects of temperature and growth rate on the properties of electrically doped Si:C films deposited using trisilane, a carbon source and a Group III/V dopant source.
Figure 9B:
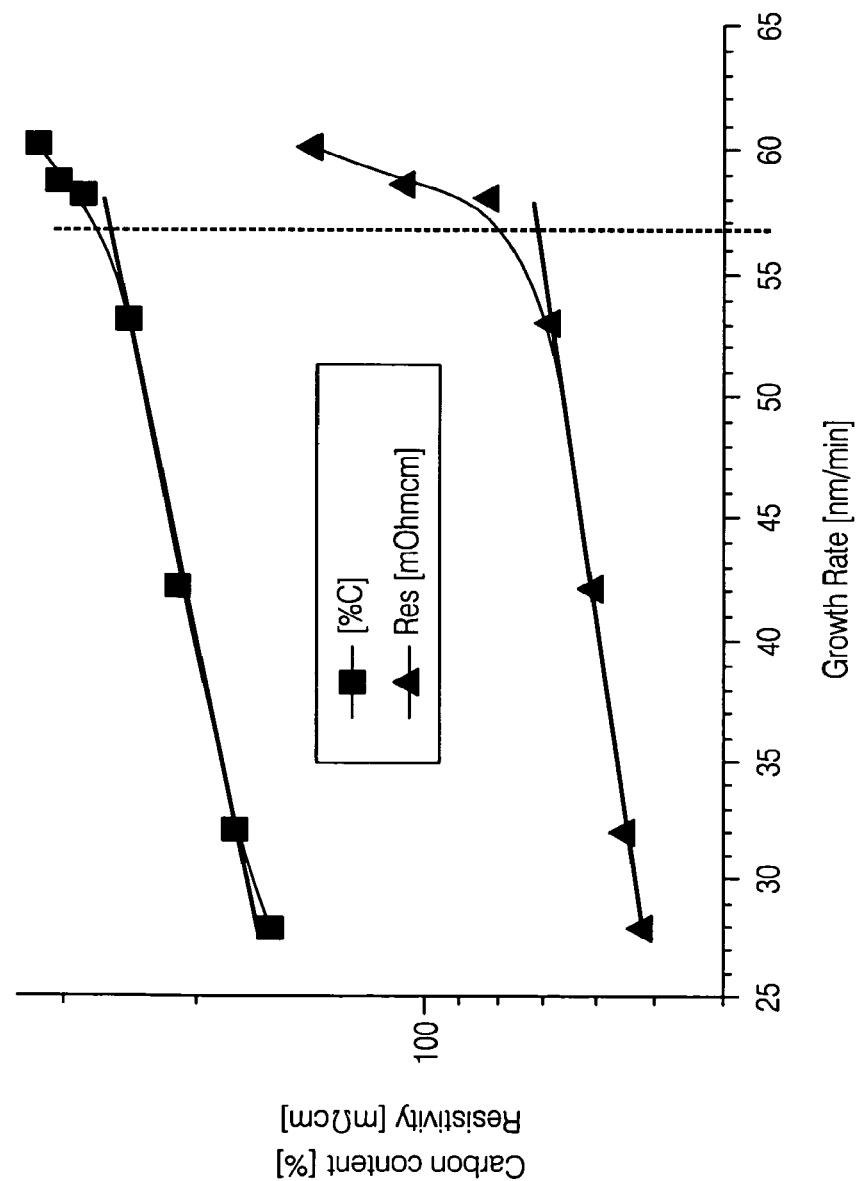
Figure 9C:
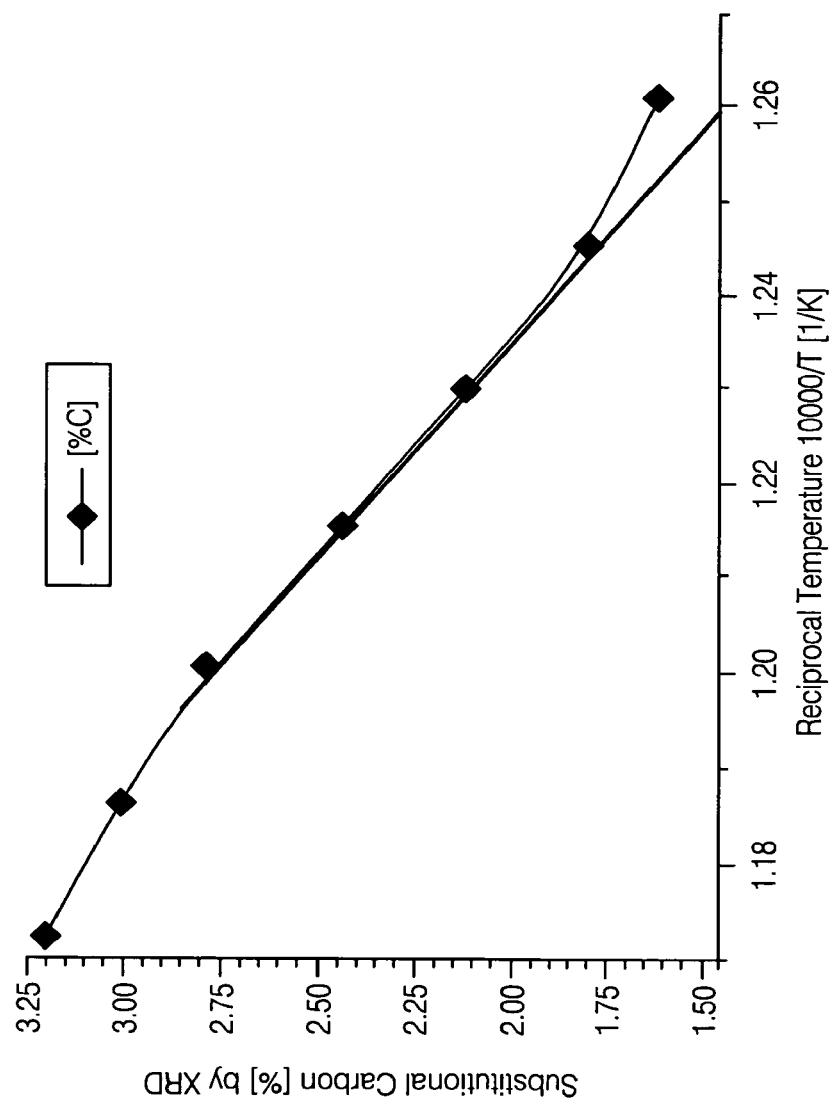
Figure 9D:
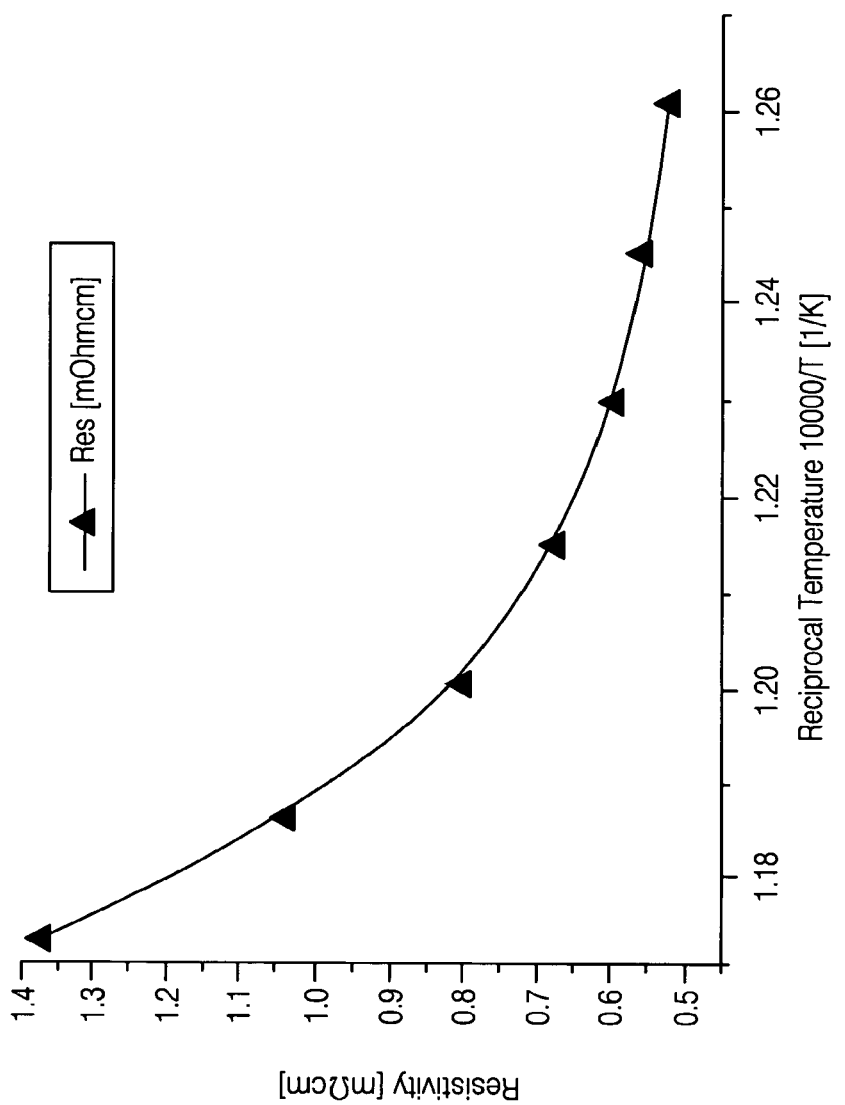

FIGS. 9A-9D illustrate the effects of temperature and growth rate on the properties of electrically doped Si:C films deposited using trisilane, a carbon source (MMS in the illustrated embodiments) and a Group III/V dopant source (arsine in the illustrated embodiments). FIG. 9A is an Arrhenius plot illustrating the effect of temperature on film growth rate, showing that higher growth rates are generally obtained at higher deposition temperatures. FIG. 9B is a plot illustrating the effect of growth rate (a function of deposition temperature, see FIG. 9A) on substitutional carbon content and resistivity, showing that higher levels of substitutional carbon and higher resistivities are generally obtained at higher growth rates. This invention is not bound by theory, but it is believed that the higher resistivities result from increased scattering that occurs at the higher levels of substitutional carbon. FIG. 9C is another Arrhenius plot illustrating the effect of deposition temperature on substitutional carbon content. FIG. 9D is another Arrhenius plot illustrating the effect of temperature on resistivity, showing that higher levels of resistivity are generally obtained at higher deposition temperatures.

FIGS. 2, 6 and 9 demonstrate that the use of trisilane enables relatively high rate depositions that in turn enable surprisingly high levels of substitutional doping. The observed similarities in doping behavior, despite the known differences among carbon and arsenic, demonstrate that deposition methods using trisilane as taught herein are relatively insensitive to the nature of the dopant or dopant precursor. Thus, the relatively high rate deposition methods using trisilane that are described herein are applicable to a wide variety of dopants (such as carbon, germanium and electrically active dopants), and to the incorporation of those dopants into a wide variety of Si-containing materials (such as Si, Si:C, SiGe, SiGe:C, etc.). Routine experimentation may be used to high rate deposition conditions applicable to a particular Si-containing material.

The thickness of an electrically doped single crystalline silicon film comprising a strain-modifying substitutional dopant such as carbon or germanium as described herein is preferably less than a critical film thickness. Those skilled in the art understand that a critical film thickness is a film thickness at which a strained film relaxes under a particular set of conditions. As the concentration of substitutional dopant increases, the critical thickness generally decreases. Films having a thickness less than the critical thickness typically remain strained under those conditions. For example, an electrically doped single crystalline silicon film comprising about 1.8% substitutional carbon may have a critical thickness of about 200 nm at about 500° C., whereas an otherwise similar film comprising 3.5% substitutional carbon may have a critical thickness of about 25-30 nm at that temperature. Films having a thickness that is less than a critical thickness for that film will tend to remain strained unless or until sufficiently perturbed (e.g., exposed to sufficient heat to cause relaxation). A relaxed Si-containing film comprising a strain-modifying substitutional dopant such as carbon or germanium may be used to exert strain on an adjacent layer, e.g., a heteroepitaxial film deposited thereover.

The methods described herein for the incorporation of substitutional electrical dopants and carbon into silicon may also be used to incorporate substitutional carbon into SiGe and to incorporate substitutional Ge into silicon. For example, in an embodiment, a deposition using trisilane, a Group III/V dopant precursor, a germanium source and chlorine is effective for incorporating germanium substitutionally into selectively deposited, electrically doped epitaxial films, e.g., for creating strain within SiGe layers. Under preferred deposition conditions, germanium incorporation levels can be between about 1% and 99%, typically between 17% and 50%, often between about 20% and about 50%, and more particularly between about 20% and 40%. The resulting SiGe films may be used in various applications, e.g., to remain strained themselves, to relax and be used to induce a tensile strain on an overlying heteroepitaxial silicon layer, or to exert a compressive stress on a channel.

As is known in the art, the lattice constant for single crystal silicon is about 5.431 Å, whereas single crystal germanium has a lattice constant of 5.657 due to the larger size of the germanium atoms. The deviation from silicon's natural lattice constant resulting from substitutional germanium incorporation introduces strain that advantageously improves electrical carrier mobility in semiconductors, improving device efficiency. When the SiGe is deposited to less than the critical thickness of the material, the deposited layer remains compressively strained and hole mobility is improved for PMOS devices. In such a case, the deposited SiGe layer can be selectively formed, e.g., over an entire active area and can define the channel, or it can act as a relaxed template for forming a compressively strained layer thereover, which can then itself serve as a channel region.

In the embodiments of FIGS. 10-15 (described below), however, the electrically doped Si:C or SiGe layer is selectively formed in recessed source/drain regions 20, and is preferably deposited under conditions (thickness, temperature) that maintain stress. The larger lattice constant of a SiGe material filling the S/D recesses exerts compressive strain on the channel region 22 therebetween, whereas the smaller lattice constant of a Si:C material filling the S/D recesses exerts a tensile strain on the channel region 22 therebetween. Preferably a dopant hydride is added to the feed gas, in addition to trisilane, etchant source and a carbon or germanium source. Preferably a n-type dopant, and more preferably arsenic or phosphorous, is employed. A electrically doped Si-containing film comprising substitutional Ge may also be formed in source/drain regions by a blanket deposition and etching sequence, in a manner similar to that illustrated in FIG. 16 for Si:C.

The processes described herein are useful for depositing electrically doped Si-containing films on a variety of substrates, and selective versions of such depositions are particularly useful for depositing Si-containing films over mixed substrates having mixed surface morphologies. As noted above, the term "mixed substrate" is known to those skilled in the art, see U.S. Pat. No. 6,900,115.

An embodiment provides a method for selectively depositing an electrically doped strained single crystalline Si:C or SiGe film onto the single crystal region(s) of a mixed substrate. In addition to the uniformity and high quality films obtained by use of trisilane, as disclosed, e.g., in U.S. Pat. No. 6,821,825, it has been found that excellent selectivity can be obtained by the use of trisilane in combination with an etchant, e.g., a halogen-containing etchant, preferably a chlorine-containing etchant such as HCl or chlorine gas ($Cl_2$). Experiments have shown that selectivity can be 100% (i.e., with zero deposition on surrounding insulators such as silicon oxide and silicon nitride). Moreover, this selectivity can be obtained without the addition of additional etchant species. HCl may be provided as an etchant to selective silicon-based deposition processes, where the etch effects upon slow-nucleating deposition on amorphous (typically insulating) surfaces is greater than the etch effects on exposed semiconductor surfaces. Chlorine is preferred as HCl is notoriously difficult to purify and typical commercial sources of HCl introduce excessive moisture into the deposition process. Such moisture can lower the conductivity of deposited films, and cause unacceptable levels of defects in epitaxial deposition. Accordingly, the use of a feed gas comprising trisilane, a carbon source and chlorine advantageously achieves high levels of selectivity without added etchants, and particularly without HCl.

Preferably, the feed gas is introduced to the chamber along with a hydrogen carrier gas, using a relatively high trisilane flow rate and a relatively low hydrogen flow rate, as compared to standard use of silane as the sole silicon precursor. The flow rate of the carbon or germanium is selected to achieve the desired level of incorporation of substitutional carbon or germanium, respectively, as discussed above. For example, in a preferred embodiment thermal CVD is carried out in an Epsilon E2500™, E3000™ or E3200™ reactor system (available commercially from ASM America, Inc., of Phoenix, Ariz.) using a trisilane flow rate of about 5 mg/min to 2,000 mg/min, more preferably between about 10 mg/min and 200 mg/min, and a MMS or germane flow rate of about 4 sccm to about 4,000 sccm. Ratios of carbon or germanium source flow rates to trisilane flow rates are preferably in the range of from about 0.5 scc/mg to about 8.0 scc/mg, more preferably from about 0.9 scc/mg to about 3.0 scc/mg. The hydrogen flow rate may be about 40 standard liters per minute (slm) or less, preferably about 10 slm or less, more preferably about 5 slm or less, and the deposition temperature may be in the range of about 450° C. to about 700° C., more preferably about 500° C. to about 650° C. Hydrogen gas flow rates are preferably minimized during deposition with trisilane/chlorine gas. Etchant flow rates are preferably 20-200 sccm. Experiments were carried out with trisilane flows of 25-400 mg/min, $H_2$ carrier flow rates of 0-4 slm, and chlorine flow rates of 25-200 sccm. Group III/V dopant precursor flow rates are typically in the range of from about 5 sccm to about 500 sccm, depending on the nature of the dopant source and the relative flow rates of the other components. For example, for phosphorus doping, dopant hydride (precursor) flow rates are preferably from 10-200 sccm of dilute phosphine (1% $PH_3$ in $H_2$).

Figure 10:
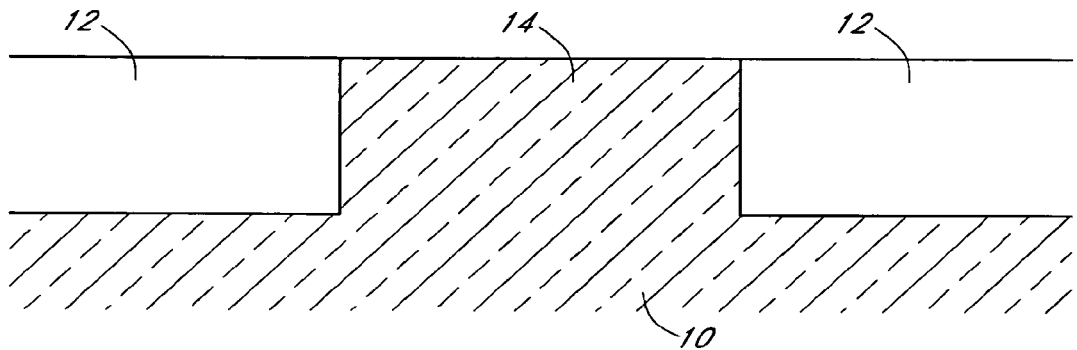
FIG. 10 is a schematic cross section of a semiconductor substrate after field oxide definition, leaving insulator and semiconductor surfaces exposed.

FIG. 10 is a schematic cross-sectional view showing a substrate 10 comprising a silicon wafer in the illustrated embodiment. The substrate 10 can include an epitaxial layer formed over a wafer or an SOI substrate. Field isolation regions 12 have been formed by conventional shallow trench isolation (STI) techniques, defining active areas 14 in windows among the STI elements. Alternatively, any suitable method can be used to define field insulating material, including local oxidation of silicon (LOCOS) and a number of variations on LOCOS or STI. It will be understood that several active areas are typically defined simultaneously by STI across the substrate 10, and that the STI often forms a web separating transistor active areas 14 from one another. The substrate is preferably background doped at a level suitable for channel formation.

Figure 11:
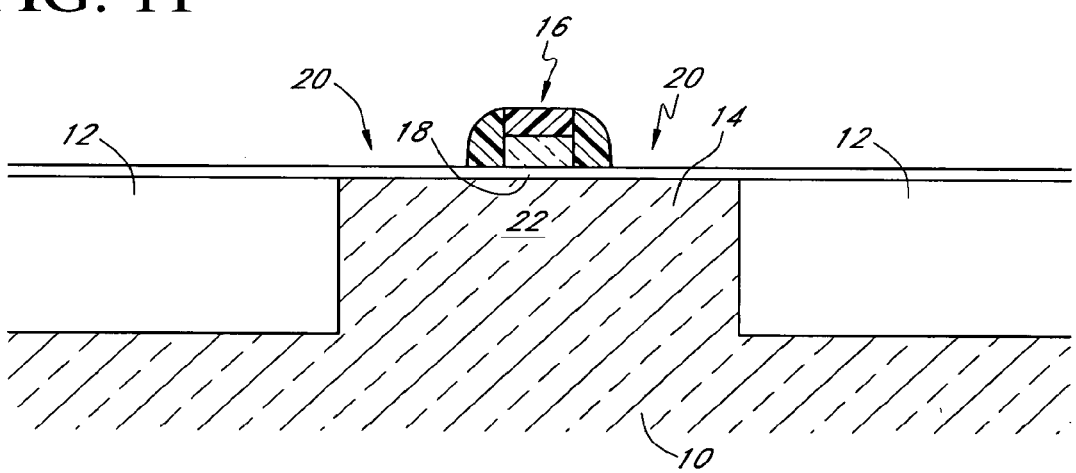
FIG. 11 shows the structure of FIG. 10 after formation of a transistor gate electrode within an active area window.

FIG. 11 illustrates the substrate 10 after formation of a gate electrode 16 over the active area 14. While illustrated as a traditional silicon electrode, surrounded by insulating (typically silicon nitride) spacers and cap layers, and separated from the underlying substrate 10 by a gate dielectric layer 18, it will be understood that the transistor gate stack can have any of a variety of configurations. In some process flows, for example, the spacers can be omitted. In the illustrated embodiment, the definition of the gate electrode 16 defines source and drain regions 20 on either side of the transistor gate electrode 16 within the active area 14. The gate electrode 16 also defines a channel region 22 under the gate electrode 16 and between the source and drain regions 20.

Figure 12:
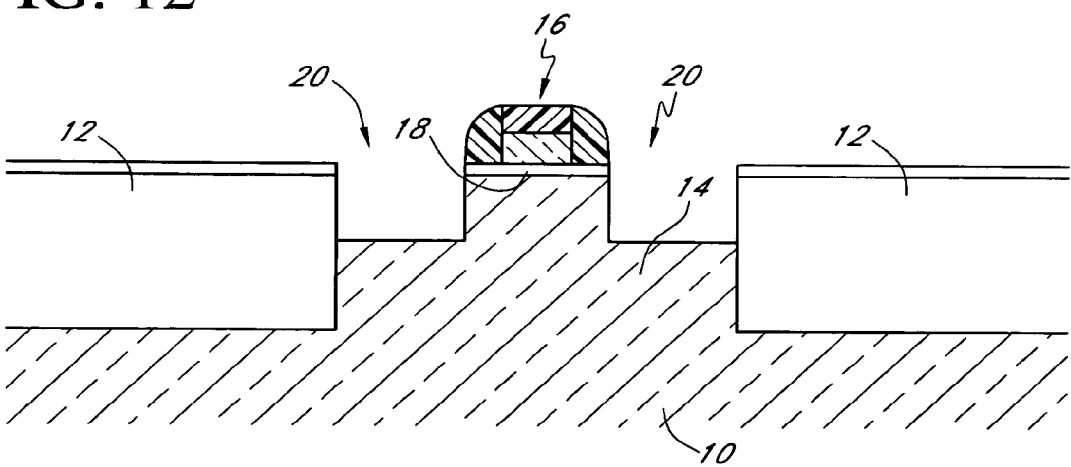
FIG. 12 shows the structure of FIG. 11 after recessing source and drain regions on either side of the gate electrode.

FIG. 12 illustrates the result of an etch step that selectively removes exposed silicon. Preferably a reactive ion etch (RIE) is employed to ensure vertical sidewall definition and minimal damage to exposed oxide and nitride materials. Preferably the depth of the recesses is less than the critical thickness of the layer to be deposited in the recess although strain on the channel can also be obtained by deposition greater than the critical thickness. As the exposed silicon is essentially the source and drain (S/D) regions 20 of the active area 14, the etch is referred to as a source/drain recess. It will be understood that, in some arrangements, a first step of clearing the thin dielectric over the source/drain regions may be employed.

Figure 13:
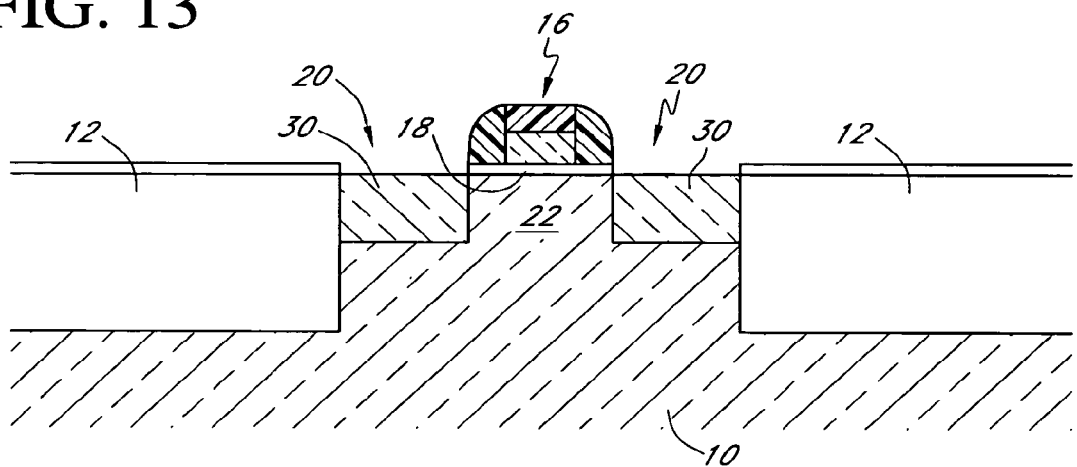
FIG. 13 shows the structure of FIG. 12 after selective deposition of a semiconductor film within the recessed regions, in accordance with a preferred embodiment.

FIG. 13 shows the result of refilling the recessed S/D regions 20 with a selective deposition process. In particular, the exposed semiconductor surfaces are cleaned, such as with an HF vapor or HF last dip, leaving a pristine surface for epitaxy thereover. Trisilane and chlorine are intermixed to form a feed gas that is introduced as described above, along with a Group III/V dopant precursor. Preferably, for the embodiment of FIGS. 10-15, a strain-modifying amount of substitutional dopant source that comprises carbon or germanium is also introduced to produce a substitutionally doped film that creates strain on the channel region, as described in more detail below. An electrically doped Si:C or SiGe heteroepitaxial layer 30 grows selectively in the S/D regions 20 and exerts strain on the channel region 22. In the illustrated embodiment, the heteroepitaxial film 30 is approximately flush with the surface of the channel region 22. As illustrated, the selective deposition minimizes or avoids deposition over the amorphous regions, e.g., over the insulators include field isolation regions 12 (generally a form of silicon oxide) and the spacers cape on the gate electrode 16 (typically silicon nitride).

Figure 14:
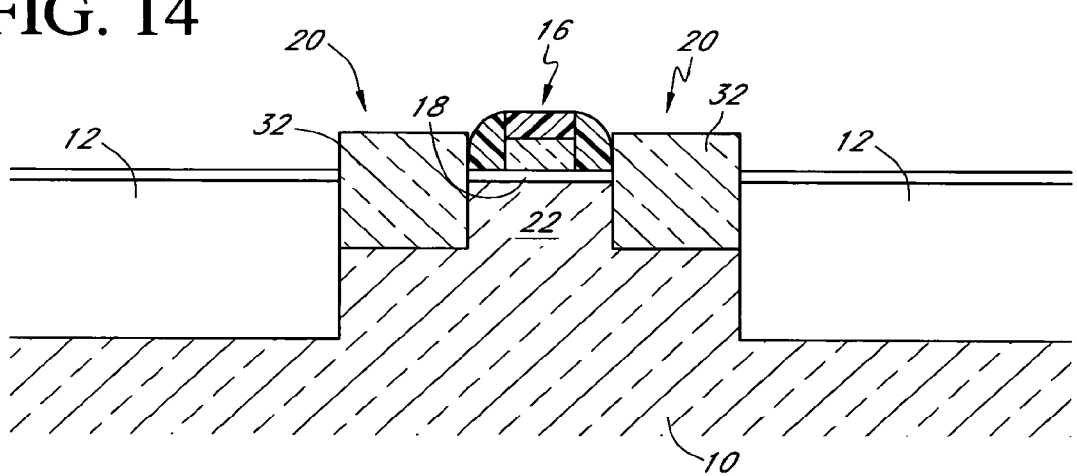
FIG. 14 shows the structure of FIG. 12 after optional continued selective deposition, forming elevated source/drain structures.

FIG. 14 illustrates an optional extension of the selective deposition to form elevated S/D regions 20 with the extended heteroepitaxial film 32. As the portion of the extended film 32 below the surface of the channel region 22 exerts lateral stress on the channel region 22, the portion above the surface of the substrate need not include as much or any lattice deviation from the natural silicon lattice constant. Accordingly, any germanium or carbon source gases, as the case may be, can be tapered or halted for the portion of the selective deposition above the surface of the channel region 22, and trisilane, Group III/V dopant precursor and chlorine flows continued.

The elevated S/D structure 32 of FIG. 14 advantageously provides additional silicon material above the surface of the substrate 10. As is known in the art, through subsequent processing, insulating layers are deposited and contacts are made through the insulating film to the source and drain regions 20. The additional silicon material facilitates formation of silicide contacts, which reduce contact resistance (form ohmic contacts). Accordingly, nickel, cobalt or other metal is deposited into the contact hole and allowed to consume the excess silicon without disturbing electrical properties of shallow junctions for the underlying source/drain regions.

Figure 15:
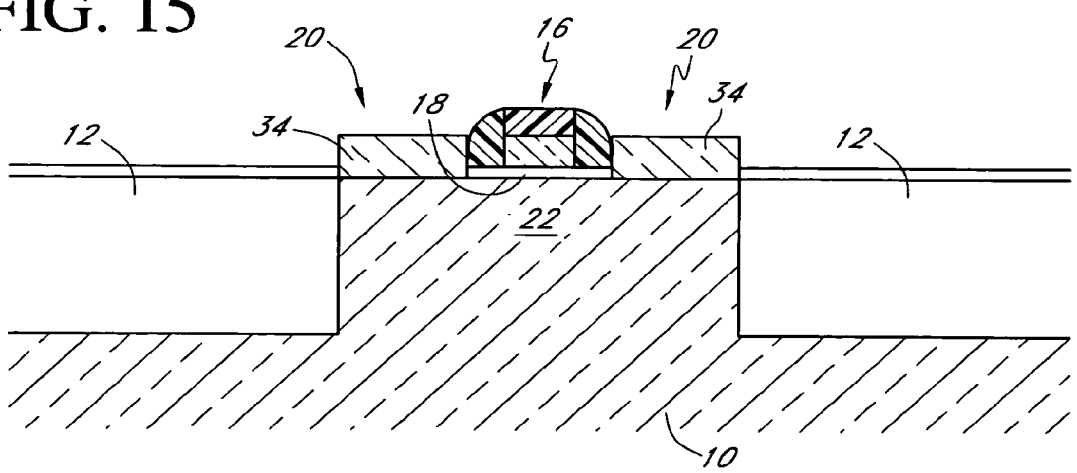
FIG. 15 shows the structures of FIG. 11 after exposing the semiconductor window and conducting a selective deposition to form elevated source/drain structures, in accordance with another preferred embodiment.

FIG. 15 shows another embodiment, in which the structure of FIG. 11 is subjected to the selective deposition using trisilane, Group III/V dopant precursor and an etchant source, without the intervening S/D recess step. In this case, the selective deposition serves only to raise the source and drain regions, providing excess doped silicon 34 to permit consumption by contact silicidation without destroying shallow junctions.

Advantageously, the selective nature of the trisilane/Group III/V dopant precursor/halogen-containing etchant process obviates subsequent pattern and etch steps to remove excess deposition from over field regions. Even imperfect selectivity can advantageously permit use of a timed wet etch to remove unwanted deposition over insulating surfaces, rather than requiring an expensive mask step. Furthermore, superior film quality is obtained at relatively high deposition rates, improving throughput. For example, certain process embodiments may be used to selectively deposit phosphorous-doped Si using trisilane, phosphine and chlorine to form, e.g., an emitter structure of a heterobipolar transistor (HBT). Other selective deposition process embodiments may be used to form an elevated source/drain (ESD) structure, a contact plug for DRAM and/or SRAM, using e.g., trisilane, phosphine and chlorine at a deposition temperature of about 550° C.

Figure 16A:
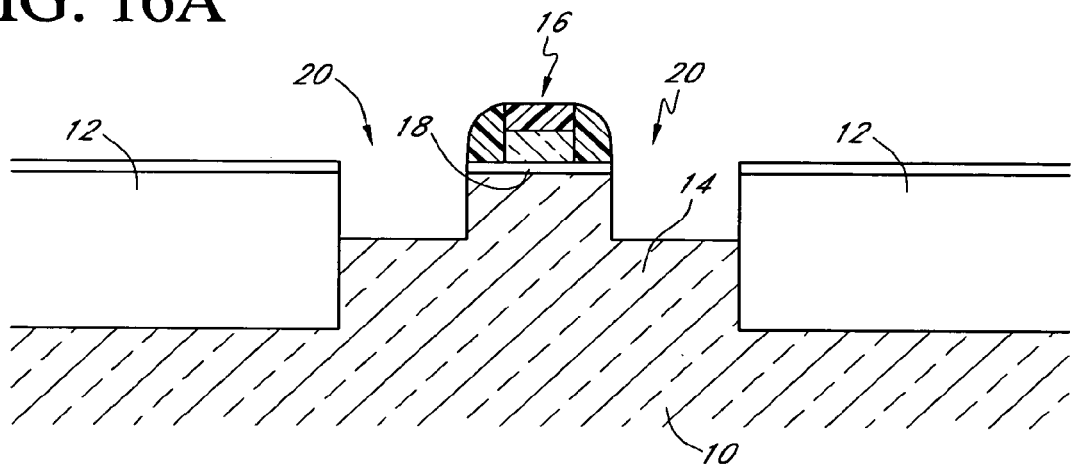
FIGS. 16A-C show a series of schematic cross sections of a semiconductor substrate and illustrate a method of forming source/drain regions by blanket deposition and etching, in accordance with another preferred embodiment.
Figure 16B:
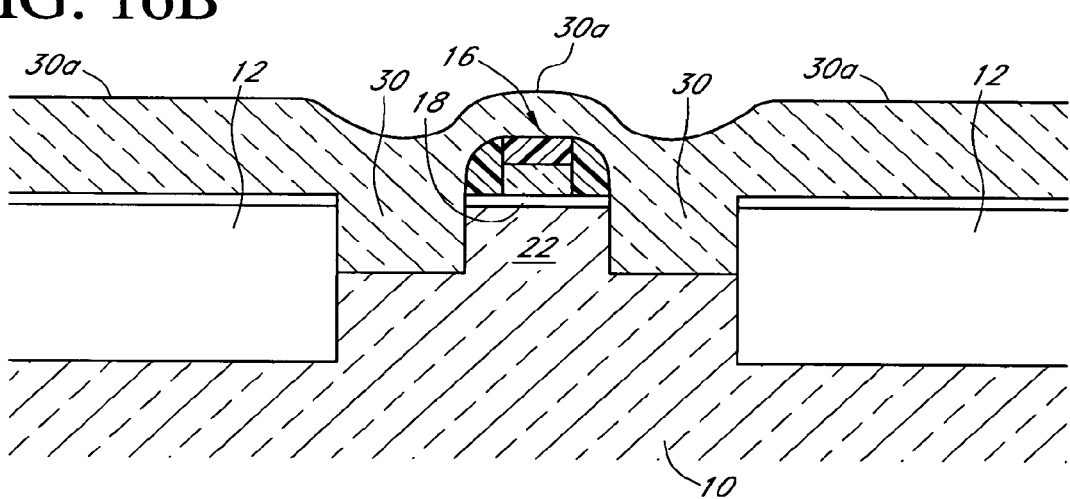

An electrically doped Si:C or SiGe layer may be selectively formed in recessed source/drain regions 20 as discussed above. However, the Si:C or SiGe layer may also be formed by a process that involves a blanket deposition of the Si:C or SiGe layer, followed by etching so that single crystalline Si:C or SiGe remains in the recessed source/drain regions 20. An embodiment of such a process is illustrated by the sequence shown in FIGS. 16A-16C. FIG. 16A is identical to the structure shown in FIG. 12 and may be formed in the same manner. In contrast to the selective deposition process illustrated in FIG. 13 however, FIG. 16B shows the result of a blanket deposition process in which an electrically doped heteroepitaxial Si:C film 30 fills the source/drains regions 20, and in which a electrically doped polycrystalline Si:C film 30a is deposited over the field isolation regions 12 and the gate electrode 16. The methods described above for depositing an electrically doped single crystalline silicon film that comprises substitutional carbon may be employed to deposit the electrically doped single crystalline Si:C film 30 and the electrically doped polycrystalline SiC film 30a. The electrically doped single crystalline Si:C film 30 is preferably deposited under conditions (thickness, temperature) that maintain stress. As discussed above, the smaller lattice constant of the Si:C material filling the source/drain recesses exerts tensile strain on the channel region 22 therebetween. Preferably, electrical doping is accomplished by adding a dopant hydride to the feed gas, in addition to the trisilane and carbon source. Preferably arsine or phosphine are employed.

Figure 16C:
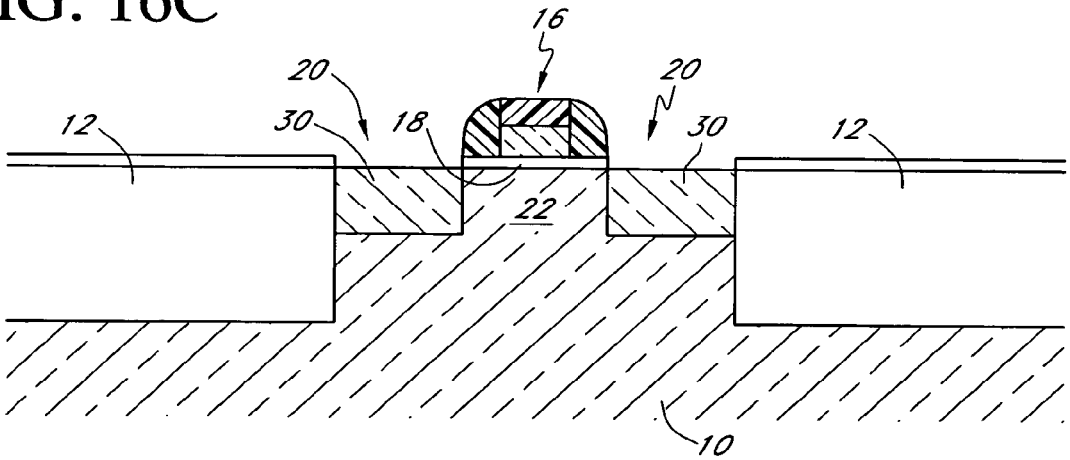

FIG. 16C is similar to FIG. 13 above, except that the depicted structure results from removing the polycrystalline Si:C film 30a using etching conditions that are selective for the removal of polycrystalline silicon against single crystal silicon. Such etching conditions are known to those skilled in the art.

The process illustrated in FIG. 16 may be used in various situations in which it is desirable to exert a tensile stress on a single crystalline Si-containing region (such as the channel region 22), and particularly to increase the carrier mobility in the tensile stressed region (the region to which the tensile stress is applied, such as the channel region 22). Preferably, the carrier mobility (e.g., hole mobility or electron mobility) is increased by at least about 10%, more preferably by at least about 20%, as compared to a comparable region that is substantially identical to the tensile stressed region except that it is not tensile stressed.

Figure 17:
FIG. 17 is a schematic cross-sectional view of a phosphorous-doped epitaxial single crystalline silicon film deposited on a silicon substrate.

FIG. 17 illustrates a phosphorous-doped epitaxial Si film 165 formed by non-selective deposition onto a single crystal Si substrate 170. In the illustrated embodiment, the Si film 165 is deposited at a deposition rate of about 90 nm/min using a trisilane flow rate of 100 mg/min, a carrier gas (hydrogen) flow rate of 2 slm, a diluted phosphine (1% in $H_2$) flow rate of 100 sccm, and a deposition pressure of about 60 Torr. The resulting Si film 165 contains about $5 \times 10^{20}$ atoms $cm^{-3}$ of phosphorous and has a resistivity of about 0.4 mΩ·cm.

An embodiment provides a doped crystalline Si-containing film comprising at least about $3 \times 10^{20}$ atoms $cm^{-3}$ of an n-dopant and having a resistivity of about 0.7 mΩ·cm or less. Such a film made by made by the methods described herein, and thus may contain substitutional carbon or germanium. Preferred doped crystalline Si-containing films have a resistivity of about 0.5 mΩ·cm or less, more preferably about 0.4 mΩ·cm or less. In an embodiment, the doped crystalline Si-containing films comprise least about $4 \times 10^{20}$ atoms $cm^{-3}$ of the n-dopant. As discussed above, the doped crystalline Si-containing film may comprise less than about $3 \times 10^{19}$ atoms $cm^{-3}$ of an electrically inactive dopant, more less than about $2 \times 10^{19}$ atoms $cm^{-3}$ of an electrically inactive dopant, even more preferably less than about $1 \times 10^{19}$ atoms $cm^{-3}$ of an electrically inactive dopant. Preferably, the n-dopant comprises phosphorous or arsenic.

In another embodiment, an integrated circuit comprises a doped crystalline Si-containing film as described herein, e.g., a doped crystalline Si-containing film comprising at least about $3 \times 10^{20}$ atoms $cm^{-3}$ of an n-dopant and having a resistivity of about 0.7 mΩ·cm or less or variants thereof as described immediately above. For example, an embodiment provides an integrated circuit comprising a first electrically doped single crystalline Si-containing region and a second electrically doped single crystalline Si-containing region, at least one (preferably both) of the first single crystalline Si-containing region and the second single crystalline Si-containing region comprising an amount of substitutional carbon effective to exert a tensile stress on a third electrically doped single crystalline Si-containing region positioned between the first single crystalline Si-containing region and the second single crystalline Si-containing region, the third electrically doped single crystalline Si-containing region exhibiting an increase in carrier mobility of at least about 10% as compared to a comparable unstressed region. The integrated circuit may comprise one or more transistors in which the first electrically doped single crystalline Si-containing region comprises a source, the second electrically doped single crystalline Si-containing region comprises a drain, and the third electrically doped single crystalline Si-containing region comprises a channel. An example of such a transistor is illustrated in FIG.

14C, in which the first and second Si-containing regions comprise the source/drain 30, and the third single crystalline Si-containing regions comprises the channel 22. In another embodiment, the integrated circuit comprises a contact (e.g., a contact block) that comprises the doped crystalline Si-containing film. In another embodiment, the integrated circuit comprises an epitaxial emitter that comprises the doped single crystalline Si-containing film. The doped crystalline Si-containing films described herein may be used to form various doped silicon structures used in a variety of semiconductor fabrication, MEMS device fabrication and flat panel display applications, including the integrated circuit structures described above, by adapting known fabrication methods in view of the guidance provided herein.

Deposition of Si-containing films using trisilane as described herein can offer significant advantages over the use of conventional silicon sources when conducted as described herein. For example, at a given deposition temperature, deposition of Si-containing films using trisilane preferably proceeds at a rate that is significantly faster than when silane is used instead of trisilane. A preferred embodiment provides a high rate deposition method in which trisilane is delivered to the substrate surface at a delivery rate of about 50-200 mg/min. Under thermal CVD conditions, preferably at a deposition temperature in the range of about 500° C. to about 800° C., practice of this embodiment results in relatively fast deposition of the electrically doped Si-containing material (as compared to other silicon sources), preferably at a rate of about 50 Å per minute or higher, more preferably about 100 Å per minute or higher, even more preferably about 200 Å per minute or higher. In some embodiment, even higher deposition rates may be obtained, e.g., about 400 Å per minute or higher, more preferably about 800 Å per minute or higher, even more preferably about 1,000 Å per minute or higher. The higher deposition rates, in turn, permit high levels of substitutional (electrically active) dopant incorporation in the as-deposited films, allowing elimination or reduction of the extent of subsequent dopant activation anneals.

Preferred electrically doped Si-containing films have a thickness that is highly uniform across the surface of the film. When deposition is conducted using trisilane as described herein, the percent thickness non-uniformity for the resulting electrically doped Si-containing films is preferably about 2% or less. Depending on the mean thickness of the film, additional values for percent thickness non-uniformity may be preferred as shown in Table 1 below. Each value for % thickness non-uniformity shown in Table 1 is to be understood as if preceded by the word "about."

TABLE 1

| Mean Film Thickness | Preferred Range of % Thickness Non-Uniformity | More Preferred Range of % Thickness Non-Uniformity | Most Preferred Range of % Thickness Non-Uniformity |
| --- | --- | --- | --- |
| >150 Å | <10 | <6 | <2 |
| 100–150 Å | <10 | <7 | <3 |
| 50–99 Å | <15 | <8 | <4 |
| <50 Å | <20 | <10 | <5 |

In general, measurements of film thickness uniformity for a film deposited under a particular set of process conditions can be made by depositing the film on a uniform or mixed substrate having a diameter in the range of about 200 mm to about 300 mm. Film thickness uniformity is determined by making multiple-point thickness measurements along a randomly selected diameter (with no measurements being taken within a 3 mm exclusion zone at the wafer periphery), determining the mean thickness by averaging the various thickness measurements, and determining the root mean square (rms) variability. A preferred instrument for measuring film thickness utilizes an Optiprobe™ from Thermawave, and a preferred measurement method involves using such an instrument to measure the film thickness at 49 points along a randomly selected wafer diameter. In practice, thickness variability is typically obtained directly from the instrument following such a measurement, and thus need not be calculated manually. To enable comparisons, the results can be expressed as percent non-uniformity, calculated by dividing the rms thickness variability by the mean thickness and multiplying by 100 to express the result as a percentage. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., ±6 Å) between these two points is then divided by the sum of the two measurements. This non-uniformity is expressed as a percentage herein.

In addition, the compositional uniformity of preferred electrically doped crystalline Si-containing films made in accordance with the methods described herein is materially improved as compared to corresponding films made without the use of trisilane. This invention is not bound by any theory of operation, but it is believed that the electrically doped Si-containing films have a degree of compositional uniformity that is better than corresponding Si-containing films deposited using conventional precursors such as silane, dichlorosilane (DCS) or trichlorosilane (TCS). Furthermore, crystalline (e.g., single crystalline or polycrystalline) electrically doped Si-containing alloys containing relatively high levels of substitutional dopants as deposited can be prepared by the methods described herein. For example, crystalline SiGe preferably contains about 10 atomic % Ge or greater, more preferably about 20 atomic % Ge or greater, even more preferably about 30 atomic % Ge or greater. Crystalline Si:C preferably contains between about 1% and 3.5% of carbon. Crystalline Si preferably contains at least about $3 \times 10^{20}$ atoms $cm^{-3}$ of a Group III/V dopant, more preferably at least about $4 \times 10^{20}$ atoms $cm^{-3}$, even more preferably at least about $5 \times 10^{20}$ atoms $cm^{-3}$.

In accordance with another aspect of the invention, a non-hydrogen carrier gas is preferably employed in combination with a Group III/V dopant precursor, etchant gas, trisilane gas and, optionally, a carbon or germanium source, as described above. Hydrogen gas ($H_2$) is the most popular carrier gas employed in vapor deposition for semiconductor processing, and particularly in epitaxial deposition. There are several reasons for the popularity of $H_2$. $H_2$ can be provided with a high degree of purity. Furthermore, the thermal properties of hydrogen are such that it does not have as great a thermal effect on the wafer. Additionally, hydrogen has a tendency to act as a reducing agent, such that it combats the formation of native oxide that results from less than perfect sealing of the reaction chamber.

However, particular advantages have now been found from employing a non-hydrogen carrier gas in the Group III/V dopant precursor/trisilane/etchant deposition system described herein. Preferably helium (He), argon (Ar), neon (Ne), xenon (Xe) or nitrogen gas ($N_2$), or a combination of such inert gases, is employed in place of hydrogen. In the illustrated embodiment, He is employed, as it has thermal behavior close to that of $H_2$ and thus entails less tuning of the reactor for the adjustment from use of $H_2$ carrier gas.

There are a number of possible reaction mechanisms in the preferred trisilane/chlorine/hydrogen system described hereinabove, including the following:

(1) $Si\ (s)+Cl_2\ (g) \rightarrow SiCl_2\ (g)$ etching
(2) $Si_3H_8\ (g) \rightarrow H_3SiSiH:\ (g)+SiH_4\ (g)$ trisilane dissociation
(3) $H_3SiSiH:\ (g) \rightarrow H_2Si\!\!=\!\!SiH_2\ (g)$
(4) $SiH_2\ (g)+SiCl_2\ (s) \rightarrow 2\ Si\ (s)+2\ HCl\ (g)$ deposition
(5) $Si\ (s)+2\ HCl \leftrightarrows SiCl_2\ (g)+H_2\ (g)$ balance of deposition and etching
(6) $2\ PH_3\ (g) \rightarrow 2\ P\ (s)+3\ H_2\ (g)$ doping
(7) $PH_3\ (g)+6\ Cl\ (s) \rightarrow PCl_3\ (g)+3\ HCl\ (g)+$free surface sites
(8) $Cl_2\ (g)+H_2\ (g) \rightarrow 2\ HCl\ (g)$
Comparison: $SiH_2Cl_2\ (g) \rightarrow SiCl_2\ (g)+H_2\ (g)$ DCS decomposition Equation (1) represents an etching reaction in the system. In addition to providing etching (which is needed for selectivity to be maintained), equation (1) also produces a reactant for equation (5) that will tend to produce silicon deposition. Equation (5) represents a balance between reaction to the right (etching) and reaction to the left (deposition). Preferably conditions are such that etching dominates over insulating surfaces while deposition dominates over semiconductor windows. Without wanting to be limited by theory, it is desirable to provide a sufficient concentration of chlorine gas to produce etching for selectivity, while producing $Si:Cl_2$ that provides for deposition.

However, when free $H_2$ is present as a carrier gas (i.e., in large quantities), reaction (8) will take place, generating HCl. Increasing the concentration of HCl in the system drives both deposition/etch equations (4) and (5) in the direction of etching, thus driving down deposition rates for any given "tuned" process. A tuned process represents one in which the reactant concentrations have been tuned to achieve selective deposition.

Equation (7) illustrates yet another desirable reaction that is depressed by generation of HCl due to the presence of $H_2$ carrier gas. Equation (7) illustrates gettering of chloride adsorbed on the wafer surface. Dopant hydrides, such as arsine, phosphine and diborane (phosphine shown) tend to react with surface chlorine atoms and form volatile byproduct(s), such that surface reaction sites are freed for depositions. As with equations (4) and (5), however, increasing the HCl concentration tends to depress the desirable gettering reaction by shifting the equilibrium for equation (7) to the left.

Figure 18:
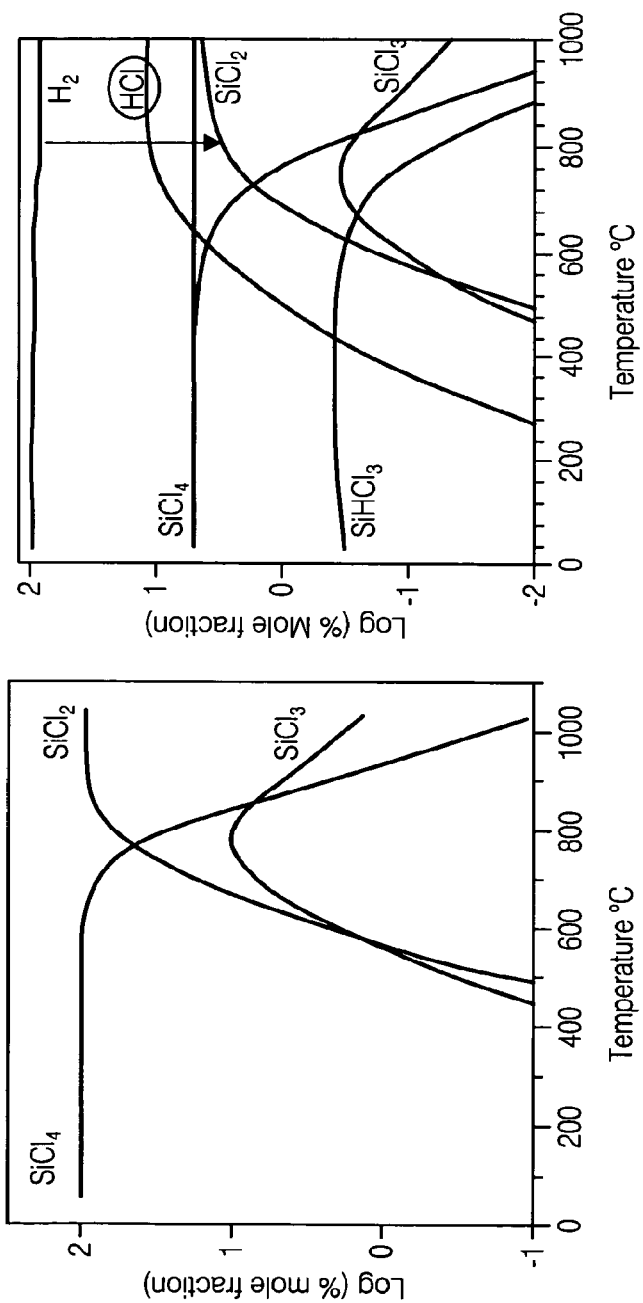
FIG. 18 shows two graphs illustrating the thermodynamic equilibria of various reactants as a function of temperature for a system including various chlorinated silicon species, with and without the addition of hydrogen carrier gas.

Accordingly, the use of a non-hydrogen carrier gas (which is generally the dominant gas in the system) will: avoid the consumption of $Cl_2$ by equation (8) and thereby avoid depressing the deposition reactions (4), (5) and the gettering reaction (7). FIG. 18, reproduced from Violette et al., J. Electrochem. Soc., Vol. 143 (1996), pp. 3290-3296 and O'Neill et al., J. Electrochem. Soc., Vol. 144 (1997), pp. 3309-3315, illustrates how the addition of $H_2$ carrier gas depresses the concentration of deposition reactant $SiCl_2$ in the Si/Cl systems of their studies. Note that, while the process preferably employs no $H_2$, the benefits of minimizing $H_2$ can be obtained without total exclusion. Preferably the main carrier gas, representing the largest source of gas in the system, is non-hydrogen.

Figure 19:
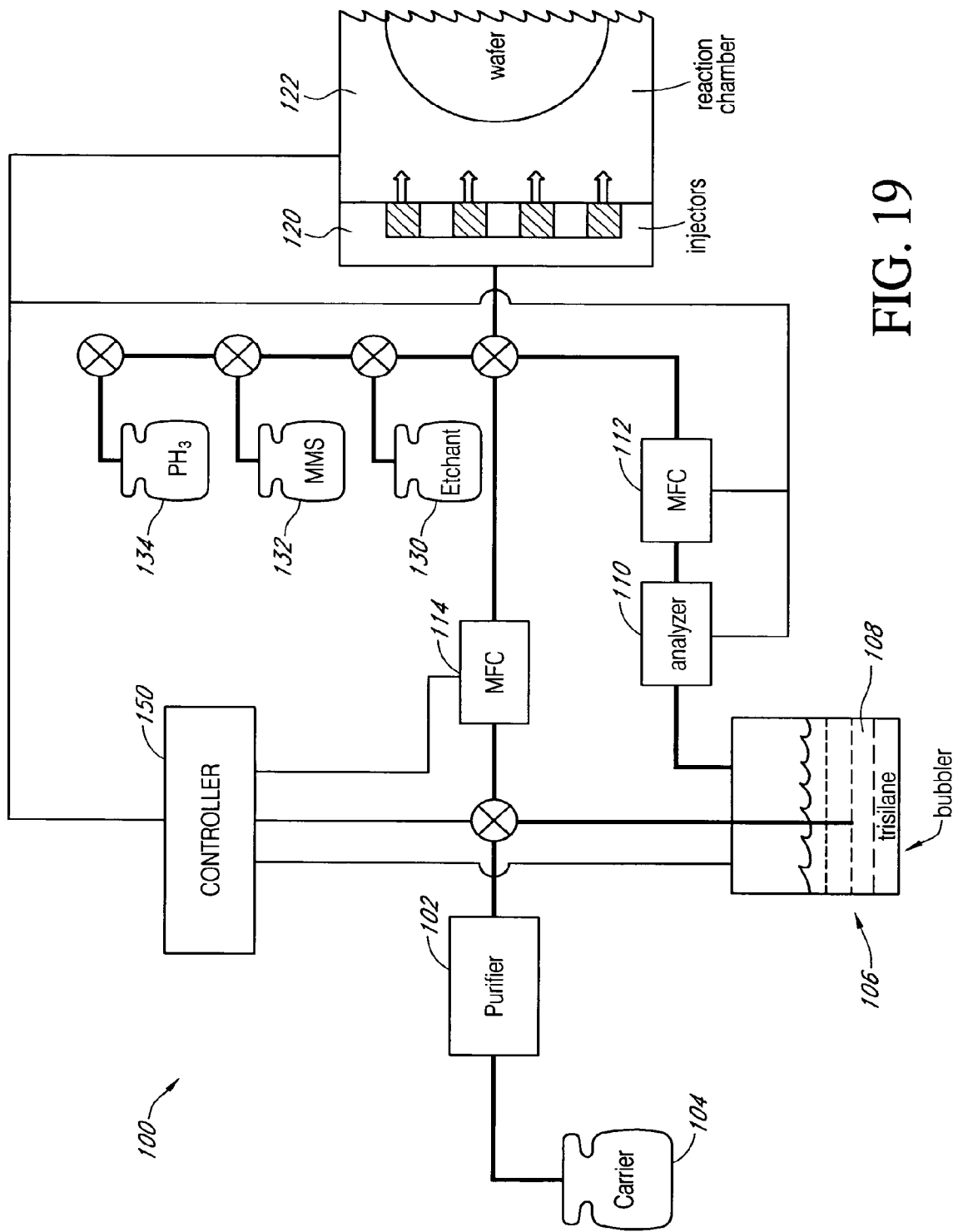
FIG. 19 is a schematic view of a reactor set up for a system employing trisilane, a phosphorous source, a carbon source, an etchant source, and a carrier gas for selectively depositing silicon-containing films in accordance with a preferred embodiment.

FIG. 19 illustrates a preferred reactor system 100 employing a carrier gas, a carbon source, a Group III/V dopant precursor, trisilane and an etchant source. As shown, a purifier 102 is positioned downstream of the carrier source 104 (helium in the illustrated embodiment). Some of the carrier gas flow is shunted to a bubbler 106, from which the carrier gas carries vaporized trisilane 108. Alternatively, the trisilane can be simply heated to increase the vapor pressure of trisilane in the space above the liquid, and the carrier gas picks up trisilane as it passes through that space. In any case, downstream of the liquid reactant source container 106 is an analyzer 110 that determines, by measuring the speed of sound through the vapor, the reactant concentration of the flowing gas. Based upon that measurement, the setpoint for the software-controlled downstream mass flow controller (WC) 112 is altered by the analyzer 110. Such analyzers are commercially available.

The flow through this WC 112 merges with the main carrier gas through the main carrier gas MFC 114 and other reactants at the gas panel, upstream of the injection manifold 120 for the deposition chamber 122. A source of etchant gas 130 (chlorine in the illustrated embodiment) is also provided. In the illustrated embodiment, a carbon source 132 (illustrated as MMS) and a source for dopant hydride 134 (phosphine shown) are also provided.

As illustrated, the reactor system 100 also includes a central controller 150, electrically connected to the various controllable components of the system 100. The controller is programmed to provide gas flows, temperatures, pressures, etc., to practice the deposition processes as described herein upon a substrate housed within the reaction chamber 122. As will be appreciated by the skilled artisan, the controller 150 typically includes a memory and a microprocessor, and may be programmed by software, hardwired or a combination of the two, and the functionality of the controller may be distributed among processors located in different physical locations. Accordingly, the controller 150 can also represent a plurality of controllers distributed through the system 100.

Accordingly, the combination of Group III/V precursor/ trisilane/chlorine/non-hydrogen carrier gas results in enhanced deposition rates for silicon-containing materials, particularly epitaxial layers. In one embodiment, the gas flow rates are selected, in combination with pressure and temperature, to achieve selective deposition of Si:C on/in semiconductor windows among insulating material.

In the illustrated embodiment, the carbon source 132 is also provided, and in combination with trisilane and chlorine, high substitutional carbon content can be achieved, as disclosed hereinabove. In another embodiment, the dopant hydride source 134 is preferably also provided to result in in situ doped semiconductor layers with enhanced conductivity. Preferably, for selective depositions, the dopant hydride is arsine or phosphine, and the layer is n-type doped. Most preferably the diluent inert gas for the dopant hydride is also a non-hydrogen inert gas. Thus, phosphine and MMS are preferably stored at their source containers 132, 134 in, e.g., helium. Typical dopant hydride concentrations are 0.1% to 5% in helium, more typically 0.5% to 1.0% in helium for arsine and phosphine. Typical carbon source concentrations are 5% to 50% in helium, more typically 10% to 30% in helium. For example, experiments are being conducted with 20% MIMS in helium.

The foregoing discussion about the benefits of non-hydrogen inert carrier gases in combination with a Group III/V dopant precursor, trisilane and chlorine gas is also applicable to other semiconductor compounds. For example, a Group III/V dopant precursor, trisilane, germane, chlorine and a non-hydrogen carrier gas will obtain the same enhanced and selective deposition benefits for electrically doped SiGe. For example, a p-type doped layer can be obtained with the addition of 1% diborane in helium.

EXAMPLES 1-4

A series of phosphorous-doped silicon films were deposited as follows: An eight-inch unpatterned Si<100> wafer substrate was loaded into an Epsilon E2500™ reactor system. The substrate was then introduced into the reactor chamber at 900° C., at a hydrogen flow rate of 20 slm, and the substrate was allowed to stabilize for 1 minute. The hydrogen flow was then reduced to 2 slm as the temperature of the substrate was reduced to 550° C. The substrate was then allowed to stabilize for 10 seconds, after which time a flow of 100 mg/min of trisilane and 200 sccm of diluted phosphine (1% in $H_2$) was introduced for 3-5 minutes at a deposition pressure of 4-32 Torr as shown in TABLE 2 below. A phosphorous-doped epitaxial silicon film was epitaxially deposited on the substrate. The substrate was then removed from the reactor and returned to the loadlock. The wafer was then removed from the reactor system. The resistivities of the films were measured as shown in TABLE 2. The thicknesses of the films were measured and used to calculate the growth rates shown in TABLE 2. A plot of growth rate vs. deposition pressure for the deposition of the films is shown in FIG. 20.

TABLE 2

| No. | Deposition Time (min.) | Pressure (Torr) | Growth Rate (nm/min) | Resistivity (center, $m\Omega \cdot cm$) |
|---|---|---|---|---|
| 1 | 5 | 4 | 18.6 | 0.34 |
| 2 | 5 | 8 | 34.4 | 0.41 |
| 3 | 3 | 16 | 55.0 | 0.57 |
| 4 | 3 | 32 | 88.4 | 0.62 |

Figure 20:
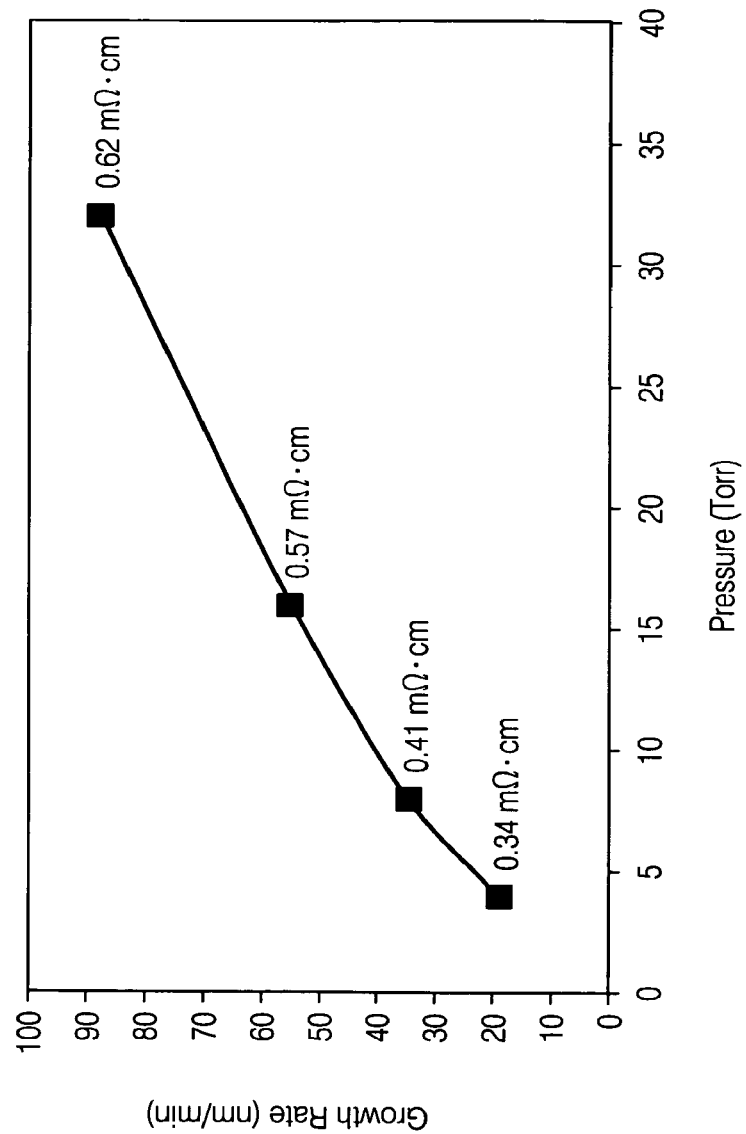
FIG. 20 is a graph of phosphorous-doped silicon film growth rate as a function of deposition pressure for a series of films deposited using trisilane and phosphine (1% in $H_2$). The resistivities of each of the deposited films (units of mΩ·cm) are also shown.

The results shown in TABLE 2 and FIG. 20 demonstrate that electrically doped silicon films having extremely low resistivities may be deposited using trisilane at high growth rates and at a relatively low deposition temperature in accordance with the methods described herein, without post-deposition annealing to activate the dopant.

All patents, patent applications and papers mentioned herein are hereby incorporated by reference in their entireties. It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. An structure comprising:
a substrate; and
an as-deposited doped single crystalline Si-containing film directly on the substrate comprising at least about $3 \times 10^{20}$ atoms $cm^{-3}$ of substitutional n-dopant, containing less than about $3 \times 10^{19}$ atoms $cm^{-3}$ of an electrically inactive dopant and having a resistivity of 0.7 $m\Omega \cdot cm$ or less, wherein the as-deposited doped single crystalline Si-containing film and substrate have a dopant profile consistent with a layer deposited by chemical vapor deposition (CVD) without post-deposition annealing.

2. The structure of claim 1, wherein the n-dopant comprises phosphorous or arsenic.

3. The structure of claim 2, wherein the as-deposited doped single crystalline Si-containing film further comprises substitutional germanium.

4. The structure of claim 1, wherein the as-deposited doped single crystalline Si-containing film has a resistivity of about 0.5 $m\Omega \cdot cm$ or less.

5. The structure of claim 1, wherein the as-deposited doped single crystalline Si-containing film has a resistivity of about 0.4 $m\Omega \cdot cm$ or less.

6. The structure of claim 1, wherein the as-deposited doped single crystalline Si-containing film comprises at least about $4 \times 10^{20}$ atoms $cm^{-3}$ of the n-dopant.

7. The structure of claim 1, wherein the as-deposited doped single crystalline Si-containing film comprises germanium.

8. The structure of claim 1, wherein the as-deposited doped single crystalline Si-containing film contains less than about $2 \times 10^{19}$ atoms $cm^{-3}$ of an electrically inactive dopant.

9. The structure of claim 1, wherein the as-deposited doped single crystalline Si-containing film contains less than about $1 \times 10^{19}$ atoms $cm^{-3}$ of an electrically inactive dopant.

10. An integrated circuit, comprising the structure comprising the as-deposited doped single crystalline Si-containing film of claim 1.

11. The integrated circuit of claim 10, wherein the as-deposited doped single crystalline Si-containing film comprises a contact block that comprises the doped single crystalline Si-containing film.

12. The integrated circuit of claim 10, wherein the as-deposited doped single crystalline Si-containing film comprises an epitaxial emitter that comprises the doped single crystalline Si-containing film.

* * * * *